(12) United States Patent
Christy

(10) Patent No.: US 8,115,229 B2
(45) Date of Patent: Feb. 14, 2012

(54) ARRANGEMENT FOR DISSIPATING THERMAL ENERGY GENERATED BY A LIGHT EMITTING DIODE

(75) Inventor: Alexander C. Christy, Carmel, IN (US)

(73) Assignee: CID Technologies LLC, Carmel, IN (US)

( * ) Notice: Subject to any disclaimer, the term of this patent is extended or adjusted under 35 U.S.C. 154(b) by 152 days.

(21) Appl. No.: 12/728,016

(22) Filed: Mar. 19, 2010

(65) Prior Publication Data

US 2010/0252854 A1    Oct. 7, 2010

Related U.S. Application Data

(60) Provisional application No. 61/161,611, filed on Mar. 19, 2009.

(51) Int. Cl.
*H01L 21/00* (2006.01)

(52) U.S. Cl. .............................. 257/99; 257/88; 257/100

(58) Field of Classification Search .................... 257/88, 257/99, 100
See application file for complete search history.

(56) References Cited

U.S. PATENT DOCUMENTS

| | | | |
|---|---|---|---|
| 3,458,779 A | 7/1969 | Blank et al. | |
| 3,805,347 A | 4/1974 | Collins et al. | |
| 4,035,199 A | 7/1977 | Anthony et al. | |
| 4,135,027 A | 1/1979 | Anthony et al. | |
| 4,160,679 A | 7/1979 | Houston et al. | |
| 4,267,559 A * | 5/1981 | Johnson et al. | 257/99 |
| 4,920,404 A * | 4/1990 | Shrimali et al. | 257/98 |
| 5,119,174 A | 6/1992 | Chen | |
| 5,160,201 A | 11/1992 | Wrobel | |
| 5,173,839 A | 12/1992 | Metz, Jr. | |
| 5,561,346 A | 10/1996 | Byrne | |
| 5,585,783 A | 12/1996 | Hall | |
| 5,722,767 A | 3/1998 | Lin | |
| 5,724,818 A | 3/1998 | Iwata et al. | |
| 5,726,535 A | 3/1998 | Yan | |
| 5,806,965 A | 9/1998 | Deese | |
| 6,121,661 A | 9/2000 | Assaderaghi et al. | |
| 6,196,002 B1 | 3/2001 | Newman et al. | |
| 6,407,411 B1 * | 6/2002 | Wojnarowski et al. | 257/99 |
| 6,521,916 B2 * | 2/2003 | Roberts et al. | 257/100 |
| 6,525,386 B1 * | 2/2003 | Mills et al. | 257/433 |

(Continued)

OTHER PUBLICATIONS

PCT Int'l Search Report for PCT/US2010/028008 completed by the US Searching Authority on Apr. 29, 2010.

*Primary Examiner* — Laura Menz
(74) *Attorney, Agent, or Firm* — Benesch, Friedlander, Coplan & Aronoff, LLP

(57) ABSTRACT

An arrangement for dissipating thermal energy generated by an LED includes an LED and a thermal energy dissipating medium. The LED includes an LED circuit, encapsulating material surrounding the LED circuit, and first and second electrical leads extending into the encapsulating material and electrically connected to the LED circuit. The thermal energy dissipating medium defines an opening therethrough sized to receive therein the LED such that the thermal energy dissipating medium defining the opening is in physical, thermally conductive contact with an exterior surface of at least one side portion of the encapsulating material of the LED. The thermal energy dissipating medium is not electrically connected to any of the LED circuit, the mounting surface, the first electrical lead and the second electrical lead. The thermal energy dissipating medium is formed of a material having a thermal conductivity of greater than or equal to 50 W/mK.

20 Claims, 9 Drawing Sheets

U.S. PATENT DOCUMENTS

| | | | |
|---|---|---|---|
| 6,561,680 B1* | 5/2003 | Shih | 362/294 |
| 6,580,228 B1 | 6/2003 | Chen et al. | |
| 6,707,073 B1* | 3/2004 | Yamamoto et al. | 257/99 |
| 6,711,904 B1 | 3/2004 | Law et al. | |
| 6,727,422 B2 | 4/2004 | Macris | |
| 6,743,972 B2 | 6/2004 | Macris | |
| 6,784,464 B2* | 8/2004 | Ichikawa et al. | 257/99 |
| 6,790,744 B2 | 9/2004 | Chen et al. | |
| 6,853,151 B2 | 2/2005 | Leong et al. | |
| 6,864,567 B2 | 3/2005 | Yu | |
| 6,897,486 B2* | 5/2005 | Loh | 257/81 |
| 6,940,704 B2* | 9/2005 | Stalions | 361/241 |
| 6,953,265 B2* | 10/2005 | Suehiro et al. | 362/241 |
| 6,960,776 B2* | 11/2005 | Machi | 250/504 R |
| 6,994,452 B2 | 2/2006 | Rozenberg et al. | |
| 7,038,398 B1 | 5/2006 | Lys et al. | |
| 7,038,593 B2 | 5/2006 | Pederson | |
| 7,164,230 B2* | 1/2007 | Park | 313/505 |
| 7,264,378 B2* | 9/2007 | Loh | 362/294 |
| 7,280,288 B2* | 10/2007 | Loh et al. | 359/726 |
| 7,432,187 B1* | 10/2008 | Cok | 438/609 |
| 7,456,499 B2* | 11/2008 | Loh et al. | 257/710 |
| 7,462,997 B2 | 12/2008 | Mueller et al. | |
| 7,489,086 B2 | 2/2009 | Miskin et al. | |
| 7,510,299 B2 | 3/2009 | Timmermans et al. | |
| 7,659,551 B2* | 2/2010 | Loh | 257/98 |
| 7,692,206 B2* | 4/2010 | Loh | 257/99 |
| 7,722,422 B2* | 5/2010 | Cok | 445/23 |
| 7,775,685 B2* | 8/2010 | Loh | 362/311.02 |
| 7,825,570 B2* | 11/2010 | Cok | 313/116 |
| 7,869,675 B2* | 1/2011 | Urano | 385/39 |
| 7,976,186 B2* | 7/2011 | Loh | 362/245 |
| 7,980,743 B2* | 7/2011 | Loh | 362/561 |
| 2001/0026011 A1 | 10/2001 | Roberts et al. | 257/678 |
| 2002/0004251 A1* | 1/2002 | Roberts et al. | 438/26 |
| 2002/0024808 A1* | 2/2002 | Suehiro et al. | 362/245 |
| 2003/0058650 A1* | 3/2003 | Shih | 362/294 |
| 2003/0168670 A1* | 9/2003 | Roberts et al. | 257/98 |
| 2003/0202349 A1* | 10/2003 | Suehiro et al. | 362/245 |
| 2004/0206970 A1 | 10/2004 | Martin | |
| 2005/0077623 A1* | 4/2005 | Roberts et al. | 257/724 |
| 2005/0110967 A1 | 5/2005 | Hara et al. | |
| 2005/0133810 A1* | 6/2005 | Roberts et al. | 257/99 |
| 2005/0140308 A1* | 6/2005 | Park | 315/169.3 |
| 2005/0168987 A1* | 8/2005 | Tamaoki et al. | 362/244 |
| 2006/0139932 A1 | 6/2006 | Park | |
| 2007/0103901 A1 | 5/2007 | Reid | |
| 2007/0121326 A1* | 5/2007 | Nall et al. | 362/294 |
| 2007/0211182 A1* | 9/2007 | Erchak et al. | 349/1 |
| 2007/0230184 A1 | 10/2007 | Shuy | |
| 2007/0241357 A1* | 10/2007 | Yan | 257/98 |
| 2007/0253167 A1 | 11/2007 | Chiang | |
| 2008/0239672 A1 | 10/2008 | Ghoshal et al. | |
| 2008/0278063 A1* | 11/2008 | Cok | 313/500 |
| 2008/0290787 A1* | 11/2008 | Cok | 313/503 |
| 2008/0303411 A1* | 12/2008 | Ohta et al. | 313/503 |
| 2008/0303435 A1* | 12/2008 | Cok | 313/506 |
| 2009/0095967 A1* | 4/2009 | Masui et al. | 257/98 |
| 2009/0133734 A1 | 5/2009 | Takahashi | |
| 2009/0139244 A1 | 6/2009 | Ullo et al. | |
| 2009/0146157 A1* | 6/2009 | Chiu et al. | 257/88 |
| 2009/0166656 A1* | 7/2009 | Yu et al. | 257/98 |
| 2009/0321766 A1* | 12/2009 | Chang | 257/98 |
| 2010/0237363 A1* | 9/2010 | Christy | 257/88 |
| 2010/0237364 A1* | 9/2010 | Christy | 257/88 |
| 2010/0252853 A1* | 10/2010 | Christy | 257/99 |
| 2010/0252854 A1* | 10/2010 | Christy | 257/99 |
| 2010/0277071 A1* | 11/2010 | Christy | 315/113 |
| 2011/0058372 A1* | 3/2011 | Lerman et al. | 362/235 |
| 2011/0103077 A1* | 5/2011 | Pan et al. | 362/373 |
| 2011/0121344 A1* | 5/2011 | Donofrio | 257/98 |
| 2011/0148270 A1* | 6/2011 | Bhairi | 313/46 |
| 2011/0180818 A1* | 7/2011 | Lerman et al. | 257/88 |
| 2011/0193105 A1* | 8/2011 | Lerman et al. | 257/88 |
| 2011/0193106 A1* | 8/2011 | Lerman et al. | 257/88 |
| 2011/0193114 A1* | 8/2011 | Lerman et al. | 257/91 |
| 2011/0198631 A1* | 8/2011 | Lerman et al. | 257/91 |
| 2011/0198632 A1* | 8/2011 | Lerman et al. | 257/91 |
| 2011/0204390 A1* | 8/2011 | Lerman et al. | 257/88 |
| 2011/0204391 A1* | 8/2011 | Lerman et al. | 257/88 |

* cited by examiner

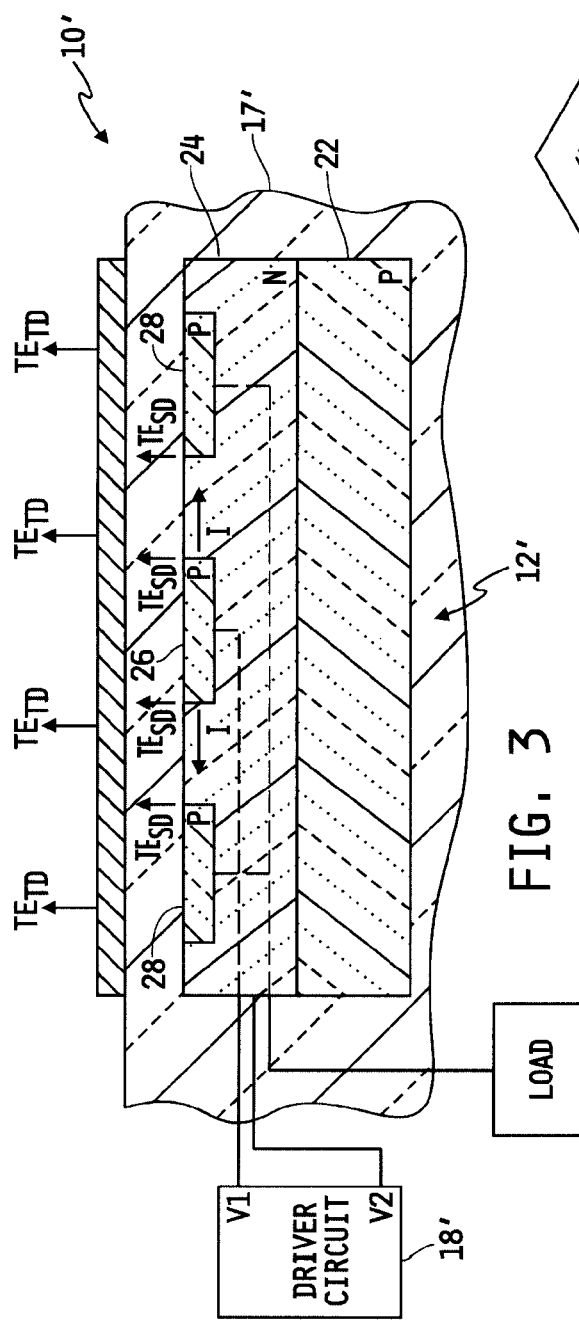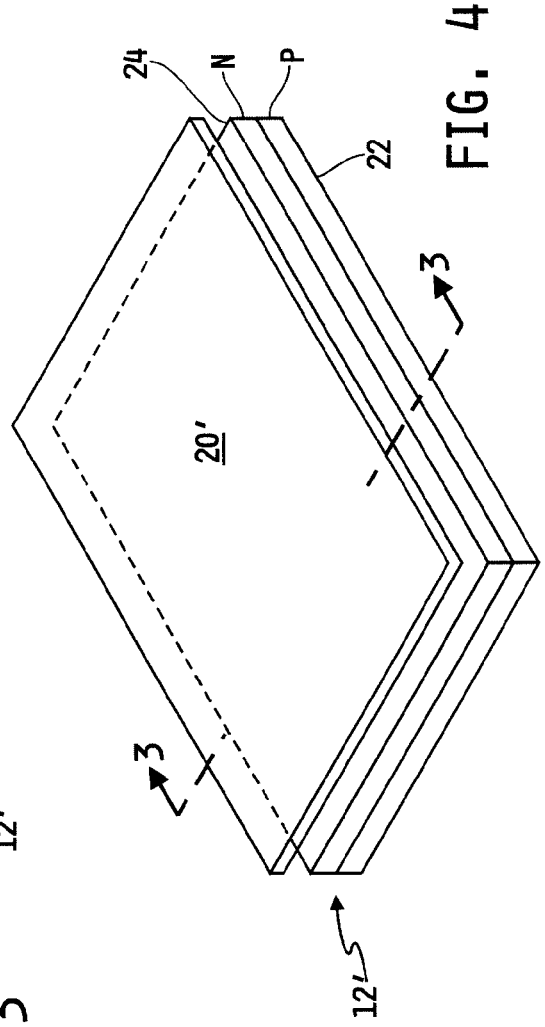
FIG. 3
FIG. 4

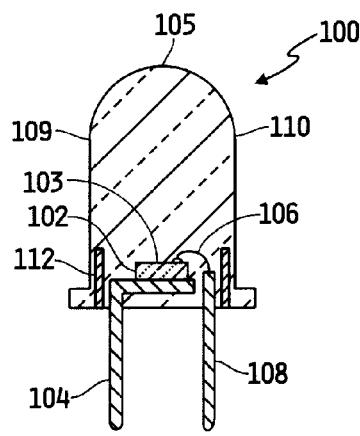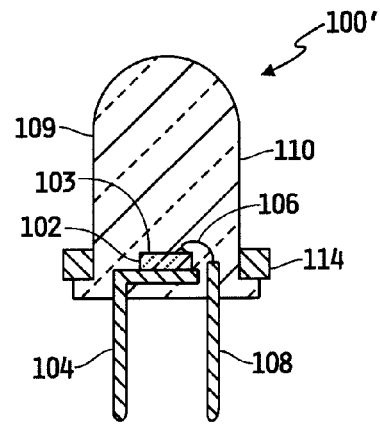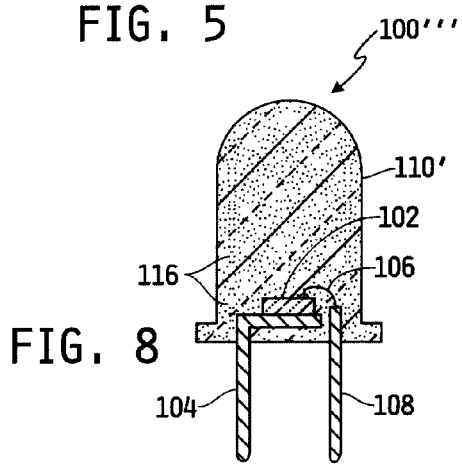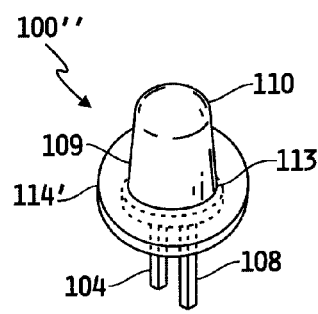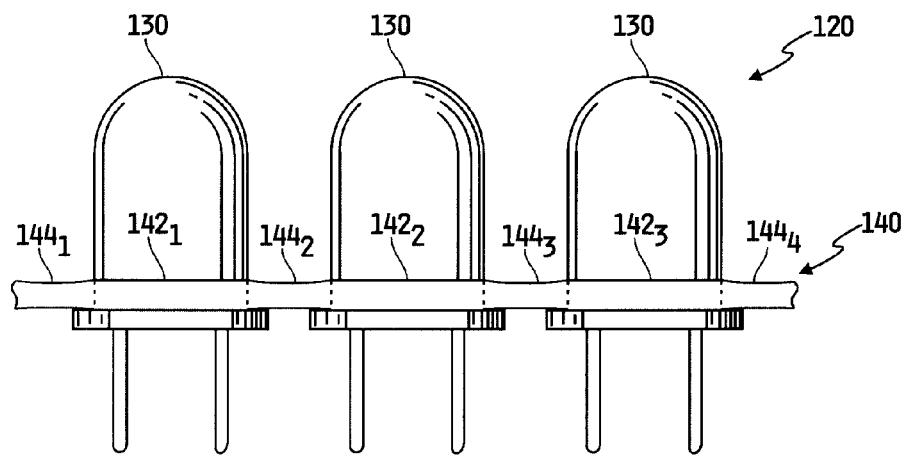

ARRANGEMENT FOR DISSIPATING THERMAL ENERGY GENERATED BY A LIGHT EMITTING DIODE

CROSS-REFERENCE TO RELATED PATENT APPLICATION

This patent application claims priority to and the benefit of U.S. Provisional Patent Application Ser. No. 61/161,611, filed Mar. 19, 2009, the disclosure of which is incorporated herein by reference.

FIELD OF THE INVENTION

The present invention relates generally to structures and techniques for dissipating thermal energy, and more specifically to structures and techniques for dissipating thermal energy generated by current flow in semiconductor circuits.

BACKGROUND

In the operation of conventional semiconductor circuits, thermal energy generated by current flow across one or more semiconductor junctions results in increased temperature of the junction, the semiconductor material surrounding the junction and also of the environment surrounding the semiconductor circuit. It is desirable to dissipate at least some of the thermal energy generated as a result of such current flow before such thermal energy results in an undesirable increase in the temperature of the semiconductor material and its surrounding environment.

SUMMARY

The present invention may comprise one or more of the features recited in the attached claims, and/or one or more of the following features and combinations thereof. An arrangement for dissipating thermal energy generated by a light emitting diode (LED) may comprise and LED and a thermal energy dissipating medium. The LED may include an LED circuit having a top surface from which radiation is emitted in response to current flow through the LED circuit and an opposite bottom surface mounted to a mounting surface, encapsulating material surrounding the LED circuit, the encapsulating material defining a top portion opposite the top surface of the LED circuit, a bottom portion opposite the bottom surface of the LED circuit and at least one side portion extending between the bottom portion and the top portion, a first electrical lead extending into the encapsulating material and electrically connected to the bottom surface of the LED circuit, and a second electrical lead extending into the encapsulating material and electrically connected to the top surface of the LED. The thermal energy dissipating medium may define an opening therethrough sized to receive therein the LED such that the thermal energy dissipating medium defining the opening is in physical, thermally conductive contact with an exterior surface of the at least one side portion of the encapsulating material of the LED. The thermal energy dissipating medium is not electrically connected to any of the LED circuit, the mounting surface, the first electrical lead and the second electrical lead. The thermal energy dissipating medium may be formed of a material having a thermal conductivity of greater than or equal to 50 W/mK.

The thermal energy dissipating medium may have a thickness through which the opening is formed. The thickness may be substantially uniform between the opening and an outer periphery of the thermal energy dissipating medium.

The thermal energy dissipating medium may comprise at least one of copper (Cu) and aluminum (Al). Alternatively or additionally, the thermal energy dissipating medium may comprise one or more of copper (Cu), Aluminum (Al), Gold (Au), Silver (Au), Magnesium (Mg), Tin (Sn), Zinc (Zn), Tungsten (W) and Beryllium (Be).

The thermal energy dissipating medium may be formed of a material having a thermal conductivity of at least 200 W/mK.

The thermal energy dissipating medium may be one of rigid, flexible and semi-flexible.

The thermal energy dissipating medium may be separate from, and not connected to, the mounting surface.

The mounting surface may form part of the second electrical terminal.

The arrangement may further comprise a high surface emissivity coating applied to one or more surface of the thermal energy dissipating medium.

An interface may be defined between the opening defined through thermal energy dissipating medium and the at least one side of the encapsulating material of the LED. The arrangement may further comprise a thermally conductive medium interposed in the interface. The thermally conductive medium may facilitate transfer of the thermal energy from the LED to the thermal energy dissipating medium. The thermally conductive medium may comprise at least one of a thermally conductive grease and a thermally conductive bonding medium.

The LED circuit may define a semiconductor junction between the top and bottom surfaces thereof across which the current flows through the LED circuit. The semiconductor junction may define a plane that is substantially parallel with the top and bottom surfaces of the LED circuit. The thermal energy dissipating medium about the opening may be substantially aligned with the plane defined by the semiconductor junction of the LED circuit.

Alternatively, the thermal energy dissipation medium about the opening may intersect an angle of less than or equal to a predefined angle relative to the plane defined by the semiconductor junction of the LED circuit. Illustratively, the predefined angle may be about 60 degrees. Alternatively, the predefined angle may be about 45 degrees. Alternatively still, the predefined angle may be about 15 degrees. Alternatively still, the predefined angle may be about zero degrees such that the plane defined by the semiconductor junction of the LED circuit substantially bisects the thermal energy dissipating medium about the opening.

BRIEF DESCRIPTION OF THE DRAWINGS

FIG. 3 is a cross-sectional view of another illustrative embodiment of a thermal energy dissipating arrangement for a semiconductor circuit.

FIG. 4 is a perspective view of the embodiment illustrated in FIG. 3.

FIG. 5 is a cross-sectional view of one illustrative embodiment of a thermal energy dissipating arrangement for one example electrical component including a semiconductor circuit.

FIG. 6 is a cross-sectional view of another illustrative embodiment of a thermal energy dissipating arrangement for an electrical component of the type illustrated in FIG. 5.

FIG. 7 is a perspective view of yet another illustrative embodiment of a thermal energy dissipating arrangement for an electrical component of the type illustrated in FIG. 5.

FIG. 8 is a cross-sectional view of still another illustrative embodiment of a thermal energy dissipating arrangement for an electrical component of the type illustrated in FIG. 5.

FIG. 9 is a front elevational view of one illustrative embodiment of a thermal energy dissipating arrangement for a plurality of electrical components generally of the type illustrated in FIG. 5, which thermal energy dissipating arrangement also acts as a component mounting arrangement for the plurality of electrical components.

DESCRIPTION OF THE ILLUSTRATIVE EMBODIMENTS

For the purposes of promoting an understanding of the principles of the invention, reference will now be made to a number of illustrative embodiments shown in the attached drawings and specific language will be used to describe the same.

This patent application is related to the following U.S. patent applications, all of which claim priority to and the benefit of U.S. Provisional Patent Application Ser. No. 61/161,611, filed Mar. 19, 2009, and all of which were filed Mar. 19, 2010: (1) U.S. patent application Ser. No. 12/727,990, entitled Apparatus For Dissipating Thermal Energy Generated By Current Flow In Semiconductor Circuits and, (2) U.S. patent application Ser. No. 12/727,994, entitled Thermal Energy Dissipating And Light Emitting Diode Mounting Arrangement and, (3) U.S. patent application Ser. No. 12/728,006, entitled Flexible Thermal Energy Dissipating And Light Emitting Diode Mounting Arrangement, and (4) U.S. patent application Ser. No. 12/728,011, entitled Thermal Energy Dissipating Arrangement For A Light Emitting Diode.

Figure 1:
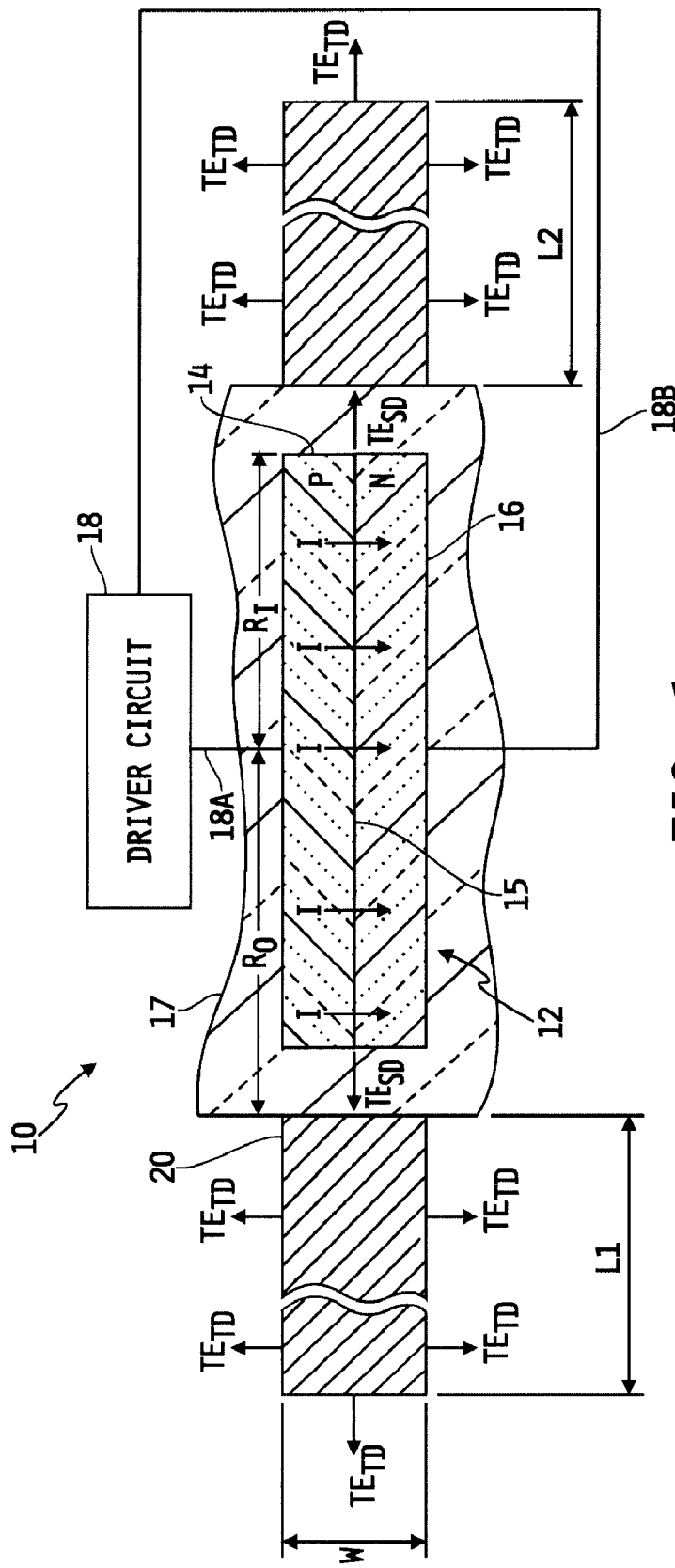
FIG. 1 is a cross-sectional view of one illustrative embodiment of a thermal energy dissipating arrangement for a semiconductor circuit.

Referring now to FIG. 1, a cross-sectional view of one illustrative embodiment of a thermal energy dissipating arrangement 10 is shown for a semiconductor circuit 12. The semiconductor circuit 12 may include any number of semiconductor junctions defined between two dissimilar semiconductor materials. The term "two dissimilar semiconductor materials" is defined for purposes of this disclosure as two semiconductors which differ in their concentration of electrons and/or holes. For example, so-called "P-type" and "N-type" semiconductor materials are, for purposes of this disclosure, two dissimilar semiconductor materials, and a conventional P-N junction therefore falls within the meaning of a semiconductor junction between two dissimilar semiconductor materials. Other examples will occur to those skilled in the art, and any such other examples are contemplated by this disclosure.

In the example illustrated in FIG. 1, a simple form of the semiconductor circuit 12 is shown and includes a single semiconductor junction 15 formed between a P-type semiconductor region or layer 14 and an N-type semiconductor region or layer 16. In one illustrative implementation, which should not be considered to be limiting in any way, the semiconductor circuit 12 illustrated in FIG. 1 is a conventional light emitting diode (LED). It will be understood, however, that the semiconductor circuit 12 may alternatively include any number of semiconductor regions or layers and any number of semiconductor junctions formed therebetween.

In the illustrated example, a driver circuit 18 is electrically connected across the semiconductor circuit 12, e.g., between the P-type region 14 and the N-type region 16, such that current flow, I, through the semiconductor circuit 12 and across the semiconductor junction 15 is generally normal to a plane defined by the semiconductor junction 15. The driver circuit 18 may be a conventional driver circuit configured to drive the semiconductor circuit 12 from a conventional DC voltage source. Alternatively, the driver circuit 18 may be a conventional driver circuit that may or may not include one or more of a conventional transformer, a conventional full-bridge rectifier circuit, a conventional half-bridge rectifier, or the like, and that is, in any case, configured to convert an AC voltage from an AC voltage source to a DC voltage suitable for driving the semiconductor circuit 12. Alternatively still, the driver circuit 18 may be configured to drive the semiconductor circuit 12 only during only one or the other one-half cycle of an AC voltage produced by an AC voltage source such that the resulting drive voltage has a net DC value with an appropriate polarity to drive the semiconductor circuit 12.

The semiconductor circuit 12 is encapsulated in a conventional encapsulating material 17, e.g., epoxy, resin-based material, or the like. The encapsulating material 17 is in physical contact with the top surface of the semiconductor layer 14, and also with each of the sides of the semiconductor circuit 12. Although FIG. 1 shows the encapsulating material 17 also in physical contact with the bottom surface of the semiconductor layer 16, it will be understood that this is for illustration purposes only, and that the bottom surface of the semiconductor layer 16 in typical implementations will actually be physically mounted to a conventional semiconductor mounting surface, e.g., a conventional lead frame or other suitable mounting surface. In such cases, the plane defined by the junction 15 illustrated in FIG. 1 will be substantially parallel to the mounting surface of the semiconductor circuit 12.

In embodiments in which the semiconductor circuit 12 is a light emitting diode (LED), for example, the encapsulating material 17 may typically be a transparent or otherwise light transmissive epoxy material that cures to a hardened state and that is typically provided in a color that matches that of the radiation produced by the LED. For other semiconductor circuits the encapsulating material may not be transparent or light transmissive and may be formed of other conventional encapsulating materials. In any case, the encapsulating material is in physical contact with, and surrounds the semiconductor circuit.

The thermal energy dissipating arrangement 10 illustrated in FIG. 1 further includes a thermally conductive medium 20 positioned substantially opposite to the plane defined by the semiconductor junction 15, and in physical contact with the encapsulating material 17 opposite the junction 15. The thermally conductive medium 20 illustratively defines an opening therethrough that extends completely about the periphery of the semiconductor circuit 12 substantially opposite to the plane defined by the semiconductor junction, as shown most clearly in FIG. 2, although this disclosure contemplates that the thermally conductive medium 20 in some embodiments may only partially surround the semiconductor circuit 20. The thermally conductive medium 20 has a thickness W, and lengths L1 and L2 on either side of the combination of the semiconductor circuit 12 and encapsulating material 17. L1 may be, but need not, be equal to L2. The thickness, W, at the opening defined through the thermal energy dissipating medium 20 defines a wall that physically contacts the outer surface of the encapsulating material. In some embodiments, the lengths L1 and/or L2 may be greater or even much greater than the thickness, W, and in other embodiments one or both of the lengths L1 and L2 may be equal to or less than W.

Semiconductor materials are generally understood to comprise crystalline structures that form crystal lattices. When current flows across a semiconductor junction formed between two dissimilar semiconductor materials, thermal energy is transferred to the crystal lattice via various processes including, but not necessarily limited to, electron-hole pair generation and recombination, photon emission in the case of light emitting diodes (LEDs), Peltier heating, electron-hole scattering and the like. At least some of these energy transfer processes result in localized heating of the crystal lattice which increases the temperature of the semiconductor circuit 12 particularly in the vicinity of the junction 15. If this increase in the semiconductor junction temperature is not adequately managed, the entire semiconductor circuit 12 as well as the environment surrounding the semiconductor circuit 12, i.e., the encapsulating material 17 illustrated in FIG. 1, will likewise rise in temperature. Without adequate thermal energy management, thermal energy resulting from such current flow across the semiconductor junction 15 may result in excessive heating of the entire semiconductor circuit 12 and its surrounding environment.

As used in this disclosure, the term "thermal energy" is defined in the context of a semiconductor circuit 12 as energy that is transferred to the semiconductor lattice when current flows across a semiconductor junction between two dissimilar semiconductor materials. When such thermal energy is transferred to the semiconductor lattice as a result of current flow across a semiconductor junction as described above, at least some of this thermal energy is directed outwardly from and parallel to the semiconductor junction in the form of heat flux resulting from the corresponding rise in temperature of the semiconductor junction 15. In the example embodiment illustrated in FIGS. 1 and 2, this thermal energy of the semiconductor device, $TE_{SD}$, is thus depicted as being directed outwardly away from the semiconductor junction 15 in all directions about the periphery of the semiconductor circuit 12 through the encapsulating material 17 surrounding the semiconductor circuit 12. The thermally conductive medium 20 extending at least partially about the semiconductor circuit 20, at least a portion of which is positioned substantially opposite to the plane defined by the semiconductor junction 15, absorbs and dissipates at least some of this thermal energy, $TE_{SD}$, that would otherwise result in heating of the entire semiconductor 12 and of the encapsulating material 17 surrounding the semiconductor circuit 12. It should be noted that in FIG. 2, the encapsulating material 17 is omitted to illustrate the thermal energy, $TE_{SD}$, that is directed outwardly away from the semiconductor device 12 toward the thermal energy dissipating medium 20, and the lengths, L1 and L2 (as well as L3 and L4), of the thermal energy dissipating medium 20 are truncated for ease of illustration.

Because this thermal energy, $TE_{SD}$ that is directed outwardly from the semiconductor device 12 from the plane defined by the semiconductor junction 15 is absorbed and dissipated by the thermally conductive medium 20, the temperature of the semiconductor circuit 12 and of the encapsulating material 17 surrounding the semiconductor circuit 12 can be effectively managed. As will be described in greater detail hereinafter, the operating temperature of the semiconductor circuit 12 and the surrounding encapsulating material 17 can be suitably controlled by appropriate choice the material used for the thermally conductive medium 20, its placement relative to the semiconductor circuit 12, its thickness and its total surface area.

Ideally, the thermally conductive medium 20 should have high thermal conductivity, i.e., should have a high ability to conduct heat. It is known that metals having high electrical conductivity also generally have high thermal conductivity, and in this regard materials that work well for the thermally conductive medium 20 include, but should not be limited to, one or any combination of, Silver (Ag), Copper (Cu), Gold (Au), Aluminum (Al), Brass, Bronze, Iron (Fe), Nickel (Ni), Zinc (Zn), Magnesium (Mg) and Tungsten (W). Non-metals having high thermal conductivity, such as diamond, zirconium and graphite, may also be used. However, practical considerations including, for example, but not limited to, cost and availability, will typically influence the choice of material (s) used for the thermally conductive medium 20. The following Table I sets forth the thermal conductivities of various materials that may be suitable for use, either alone or in combination, as the thermal energy dissipating medium 20. It will be understood, however, that Table I sets forth only examples of materials that may be used, either alone or in combination with others, as the thermal energy dissipating medium 20, and that other suitably high thermal conductivity materials that do not appear in Table I may be alternatively or additionally used.

TABLE I

| Material | Thermal Conductivity (W/mK) |
|---|---|
| Diamond | 900-2320 |
| Silver (Ag) | 429 |
| Copper (Cu) | 401 |
| Gold (Au) | 318 |
| Aluminum (Al) | 120-237 |
| Tin (Sn) | 66 |
| Steel | 45 |
| Lead (Pb) | 35.3 |
| Graphite | >120 |
| Brass | 111-120 |

TABLE I-continued

| Material | Thermal Conductivity (W/mK) |
| --- | --- |
| Bronze | 26-106 |
| Iron | 47-80 |
| Nickel (Ni) | 90 |
| Zinc (Zn) | 116 |
| Magnesium (Mg) | 160 |
| Tungsten (W) | 162-173 |
| Beryllium (Be) | 218 |
| Zirconium | 250 |

It is generally desirable to select the thermal energy dissipating medium 20 for use with the semiconductor circuit 12 to have a thermal conductivity at least, i.e., greater than or equal to, about 50 W/mK, where W/mK is understood to mean Watts per meter-Kelvin, although higher thermal conductivity materials may additionally or alternatively be used. In some applications in which the semiconductor circuit 12 is implemented in the form of a plurality of light emitting diodes, for example, materials such as Cu and Al having thermal conductivities of at least, i.e., greater than or equal to, 200 W/mK have been found to work well as the thermal energy dissipating medium.

In some embodiments it may also be desirable for the thermally conductive medium 20 to have a low coefficient of thermal expansion such that linear and/or volumetric expansion or movement of the thermally conductive material over the range of operating temperatures is low. Relatively high thermally conductive materials that also have relatively low thermal expansion coefficients include, but should not be limited to, diamond, tungsten, steel, Nickel (Ni), Gold (Au), Copper (Cu), Silver (Ag), Brass, Aluminum (Al), Magnesium (Mg) and Zinc (Zn). In some embodiments, some examples of which will be described hereinafter, it may further be desirable to utilize the thermally conductive medium 20 also as the mounting and support structure for any number of semiconductor circuits 12, e.g., light emitting diodes. In this regard, a thermally conductive medium 20 formed of one or some combination of, for example, but not limited to, Copper (Cu), Aluminum (Al), Nickel (Ni), Magnesium (Mg), Zinc (Zn), Tungsten (W) and/or brass make good choices as strips, sheets, bands, etc. as such materials can not only be dimensioned to support a plurality of semiconductor circuits 12, e.g., LEDs, they can also be made flexible or semi-flexible so as to be formable to any desired or target shape either before or after mounting a plurality of semiconductor circuits 12, e.g., LEDs, thereto so that radiation emitted by the LEDs can be directed in multiple directions.

Generally, thermal energy is transferred from one place to another via one or more of three basic mechanisms; (1) conduction, i.e., direct thermal energy transfer through a solid, (2) convection, i.e., thermal energy transfer via movement of a fluid, and (3) radiation, i.e., thermal energy transfer via propagation of visible and non-visible radiation. For purposes of this document, thermal energy transfer will be described in terms of conventional heat transfer equations with the quantity of interest being "Q," defined here as transferred heat in conventional units, e.g., Watts. Thus, the terms thermal energy transfer and heat transfer, Q, will be used synonymously herein.

Figure 2:
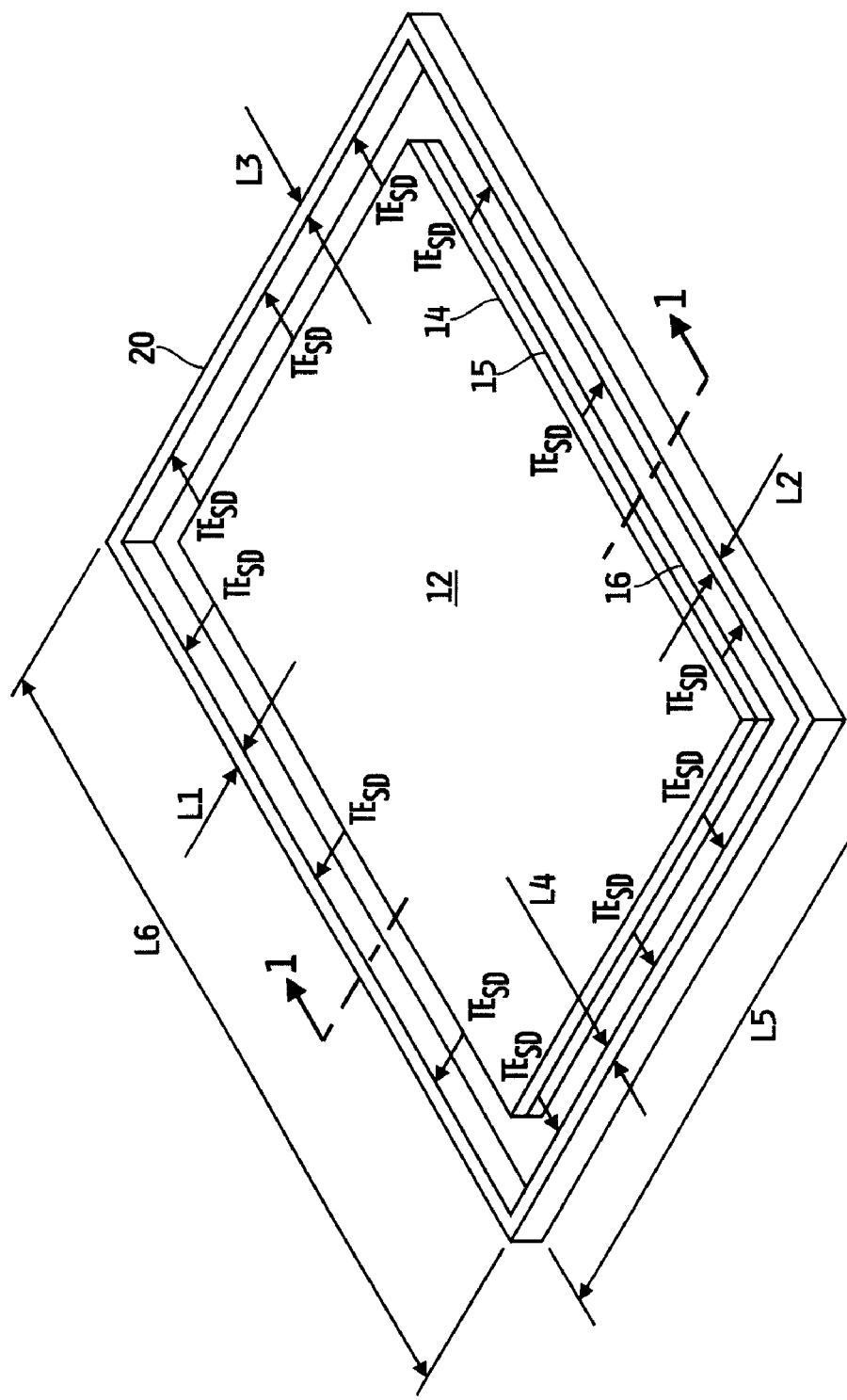
FIG. 2 is a perspective view of the embodiment illustrated in FIG. 1.

In the transfer of the thermal energy, $TE_{SD}$, from the junction 15 of the semiconductor device 12 through the encapsulating material 17 toward the thermal energy dissipating medium 20 as illustrated in FIGS. 1 and 2, only two of the conventional heat transfer mechanisms are pertinent; namely, conduction and radiation. In terms of heat transfer, Q, the two quantities of interest are thus the heat transferred from the junction 15 of the semiconductor device or circuit 12 through the encapsulating material 17 toward the thermal energy dissipating medium 20 via conduction, $Q_{SDC}$, and the heat transferred from the junction 15 of the semiconductor circuit 12 through the encapsulating material 17 toward the thermal energy dissipating medium 20 via radiation, $Q_{SDR}$. The quantity $Q_{SDC}$ is given by the conductive heat transfer equation:

$$Q_{SDC} = 2\pi kW(T_J - T_{TED})/\ln(R_O/R_I) \quad (1),$$

where $Q_{SDC}$ (Watts) is the heat transferred from the junction 15 of the semiconductor circuit or device 12 through the encapsulating material 17 toward the thermal energy dissipating medium 20 via conduction, k (Watts/degree C-meter) is the thermal conductivity of the encapsulating material 17, W is the thickness of the thermal energy dissipating material 20, $T_J$ (degrees C.) is the temperature of the semiconductor junction 15, $T_{TED}$ (degrees C.) is the temperature of the outer periphery of the encapsulating material 17 across from the semiconductor junction 15 (i.e., at the interface with the thermal energy dissipating medium 20), $R_O$ (meters) is the radius from the center of the semiconductor circuit 12 to the outer periphery of the encapsulating material 17 across from the semiconductor junction 15 (i.e., at the interface with the thermal energy dissipating medium 20), and $R_I$ is the radius from the center of the semiconductor circuit 12 to the outer periphery of the semiconductor circuit 12. The dimensional variables W, $R_O$ and $R_I$ are illustrated in FIG. 1.

It should be noted that $R_I$ will typically be an approximated value as most semiconductor circuits 12 are either square or rectangular in shape. Moreover, the semiconductor circuit 12 will typically be mounted to a lead frame (not shown in FIG. 1), which if thermally bonded to the semiconductor circuit 12, as is typically done, will necessarily become part of the heat source. For purposes of this disclosure, the term "heat source" refers to a combination of the junction 15 of the semiconductor device 12 where thermal energy is generated as a result of current flow across the junction 15 as described hereinabove, and any portion of all similarly thermally conductive structures integral with and/or physically connected, attached, mounted and/or bonded thereto that rises to within a threshold value of the operating temperature of the semiconductor junction 15 resulting from current flow across the junction 15. For example, the "heat source" in the context of the embodiment illustrated in FIG. 1 includes the junction 15 as well as the entirety of the integral semiconductor circuit 12. In embodiments in which the semiconductor circuit 12 is mounted to a lead frame, the "heat source" includes the junction 15, the entirety of the integral semiconductor circuit 12 and the lead frame to which the semiconductor circuit 12 is mounted, assuming that the lead frame is a "similarly thermally conductive structure." For purposes of this disclosure, the term "similarly thermally conductive structure" refers to any structure having a thermal conductivity that is sufficiently close to that of the semiconductor circuit 12 and that is at least an order of magnitude greater than that of the material or environment surrounding such structure(s). Any approximation of $R_I$ in embodiments that include such a lead frame or other thermally conductive structure(s) to which the semiconductor circuit 12 is mounted may therefore need to take into account the dimensions and/or geometry of such a lead frame or other thermally conductive structure(s).

It should further be noted with respect to equation (1) that as the distance between the semiconductor circuit 12 and the outer periphery of the encapsulating material 17 decreases, the ratio $R_O/R_I$ becomes smaller and the conductive thermal energy transferred from the heat source to the outer periphery of the encapsulating material 17 accordingly increases proportionally to $1/\ln(R_O/R_I)$. Likewise, as the width of the thermal energy dissipating medium 20 increases, the conductive thermal energy transferred from the heat source to the outer periphery of the encapsulating material 17 proportionally increases. However, if the position of the thermal energy dissipating medium 20 is not directly opposite to the semiconductor junction 15, e.g., and is instead positioned above or below the semiconductor circuit 12, the ratio $R_O/R_I$ increases by a factor of $\cos\theta$, where $\theta$ is the angle between the plane defined by the junction 15 of the semiconductor circuit 12 and the center of the thermal energy dissipating medium 20.

It should also be noted that the transfer of thermal energy via conduction according to equation (1) requires physical, thermally conductive contact between the thermal energy dissipating medium 20 and the encapsulating material 17 so that thermal energy can be effectively transferred through the interface between the two via conduction. In this regard, the term "physical, thermally conductive contact" between the thermal energy dissipating medium 20 and the encapsulating material 17 means that the thermal energy dissipating medium 20 and the outer periphery of the encapsulating material 17 fit tightly together in a physically contacting relationship such that thermal energy is efficiently transferred from the outer periphery of the encapsulating material 17 to the thermal energy dissipating medium 20 through the interface between these two structures, and/or that one or more additional thermally conductive medium(s) is/are interposed in the interface between the thermal energy dissipating medium 20 and the encapsulating material 17. Examples of such additional thermally conductive media include, but are not limited to, any one or combination of conventional thermally conductive greases and conventional thermally conductive bonding media such as conventional conductive adhesives, thermally conductive epoxies, or the like. In any case, the additional thermally conductive media, in embodiments that include such additional thermally conductive media, acts to facilitate the transfer of thermal energy from the outer periphery of the encapsulating material 17 to the thermal energy dissipating medium 20.

In the transfer of the thermal energy, $TE_{SD}$, from the heat source within the encapsulating material 17 through the encapsulating material 17 and toward the thermal energy dissipating medium 20 as illustrated in FIGS. 1 and 2, the quantity $Q_{SDR}$ is given by the radiative heat transfer equation:

$$Q_{SDR} = F_{SD\text{-}TED} A_{SDS} \sigma \epsilon (T_J^4 - T_{TED}^4) \qquad (2),$$

where $Q_{SDR}$ (Watts) is the heat transferred from the heat source through the encapsulating material 17 toward the thermal energy dissipating medium 20 via radiation, $F_{SD\text{-}TED}$ (dimensionless) is the "view factor" from the thermal energy emitting surface(s) of the heat source, i.e., the sides, of the semiconductor circuit 12 and including the geometry of any thermally conductive structure(s) attached, connected, mounted and/or bonded thereto, to the thermal energy absorbing surface of the thermal energy dissipating medium 20, $A_{SDS}$ (meters) is the area of the thermal energy emitting surface(s) of the heat source, $\sigma$ is the Stefan-Boltzmann constant ($5.6704 \times 10^{-8}$ W m$^{-2}$ K$^{-4}$), $\epsilon$ is the surface emissivity of the thermal energy emitting surface(s) of the heat source, $T_J$ (K) is the temperature of the semiconductor junction 15 and $T_{TED}$ (K) is the temperature of the outer periphery of the encapsulating material 17 across from the thermal energy emitting surface(s) of the heat source (i.e., at the interface of the encapsulating material 17 and the thermal energy dissipating medium 20). The view factor, $F_{SD\text{-}TED}$, depends generally upon the shapes of the thermal energy emitting and absorbing surfaces, and view factor equations and/or values for various geometrical shapes are available in published literature. As one example, the view factor between two differential areas $dA_1$ and $dA_2$ is given by $dF_{d1\text{-}d2} = [\cos\theta_1 \cos\theta_2/\pi S^2]dA_2$, where $\theta_1$ is the angle between surface 1 normal and a straight line between the two areas, $\theta_2$ is the angle between surface 2 normal and a straight line between the two areas, and S is the distance between the elements. Relating this equation back to equation 2, it can be generally concluded that radiative thermal energy transfer between two objects becomes greater as the distance S becomes less and also as $\theta_1$ and $\theta_2$ both approach zero, i.e., when the two surfaces are parallel. Conversely, as the two surfaces are moved apart from each other, the radiative thermal energy transfer between them drops proportionally to $1/S^2$, and as the two surfaces move away from a parallel relationship relative to each other the radiative heat transfer between them drops proportionally to $\cos\theta_1$ and $\cos\theta_2$.

The heat transfer variables $Q_{SDC}$ and $Q_{SDR}$ are additive so that the total thermal energy, $TE_{SD}$, transferred from the heat source within and through the encapsulating material 17 to the thickness, W, of the thermal energy dissipating medium 20 is given by the sum of equations (1) and (2) to yield:

$$TE_{SD} = 2\pi k W (T_J - T_{TED})/\ln(R_O/R_I) + F_{SD\text{-}TED} A_{SDS} \sigma \epsilon (T_J^4 - T_{TED}^4) \qquad (3).$$

Dissipation by the thermal energy dissipating medium 20 of the thermal energy absorbed from the heat source through the encapsulating material 17 occurs via rejection of the absorbed thermal energy in the form of heat rejected by the thermal energy dissipating medium 20 to the ambient surroundings, i.e., to the ambient environment surrounding the thermal energy dissipating medium 20, from the surface area of the thermal energy dissipating medium 20 that extends radially away from the opening in the thermal energy dissipating medium defined by the thickness, W, and that is exposed to the ambient environment. In the example embodiment illustrated in FIGS. 1 and 2, the thermal energy absorbed by the thermal energy dissipating medium 20, $TE_{TD}$, is thus depicted as being rejected outwardly away from every surface of the thermal energy dissipating medium 20 that is exposed to the ambient environment surrounding the thermal energy dissipating medium 20. In this heat rejection process, again only two of the conventional heat transfer mechanisms are pertinent; this time convection and radiation. In terms of heat transfer, Q, the two quantities of interest are thus the heat transferred from the thermal energy dissipating medium 20 to ambient via convection, $Q_{TDC}$, and the heat transferred from the thermal energy dissipating medium 20 to ambient via radiation, $Q_{TDR}$. The quantity $Q_{TDC}$ is given by the convective heat transfer equation:

$$Q_{TDC} = A_S h (T_S - T_{AMB}) \qquad (4),$$

where $Q_{TDC}$ (Watts) is the heat transferred by the thermal energy dissipating medium 20 to ambient via convection, $A_S$ (m$^2$) is the surface area of the thermal energy dissipating medium 20, h (Watts/m$^2$C) is the convective film coefficient of the thermal energy dissipating medium 20, $T_S$ is the surface temperature of the thermal energy dissipating medium 20 and $T_{AMB}$ is the temperature of the ambient environment surrounding the thermal energy dissipating medium 20. The convective film coefficient, h, represents the thermal resistance of a relatively stagnant layer of fluid between the thermal energy dissipating medium 20 and the fluid medium, which in the embodiment illustrated in FIGS. 1 and 2 is air. Values of h for air depends primarily on the shape of the thermal energy dissipating medium 20, and h values for standard geometric shapes can be found in publicly available literature. Alternatively or additionally, the convective film coefficient, h, for air can be computed using known equations and relationships. The surface area, $A_S$, of the thermal energy dissipating medium 20 is the total area of the thermal energy dissipating medium 20 that is exposed to the ambient environment surrounding the thermal energy dissipating medium 20. In the embodiment illustrated in FIG. 2, for example, L1=L2=L3=L4, and the total surface area of the thermal energy dissipating medium is $A_S$=4L1 L5+4L1L6+2WL5+ 2WL6. It will thus be appreciated that three of the four sides of the thermal energy dissipating medium 20 reject heat to the ambient environment surrounding the thermal energy dissipating medium 20, with the surface of the thermal energy dissipating medium 20 that is in contact with the encapsulating material 17 being the only side that does not. Any one or more of the lengths L1-L6 may vary about the periphery of the thermal energy dissipating medium 20 or may alternatively be substantially constant. Similarly, the thickness, W, of the thermal energy dissipating medium 20 may be substantially constant across all lengths, or may alternatively vary across any one or more of the lengths L1-L6.

In the transfer of the thermal energy, $TE_{TD}$, from the thermal energy dissipating medium 20 to ambient as illustrated in FIG. 1, the quantity $Q_{TDR}$ is given by the radiative heat transfer equation:

$$Q_{TDR}=A_S\sigma\epsilon(T_S^4-T_{AMB}^4) \quad (5),$$

where $Q_{TDR}$ (Watts) is the heat transferred from the thermal energy dissipating medium 20 to ambient via radiation, $A_S$ (m$^2$) is the total surface area of the thermal energy dissipating medium 20 that is exposed to the ambient environment surrounding the thermal energy dissipating medium 20, $\sigma$ is the Stefan-Boltzmann constant (5.6704×10$^{-8}$ W m$^{-2}$ K$^{-4}$), $\epsilon$ is the surface emissivity of the thermal energy dissipating medium 20, $T_S$ (K) is the surface temperature of the thermal energy dissipating medium 20 and $T_{AMB}$ (K) is the temperature of the ambient environment surrounding the thermal energy dissipating medium 20. It will be noted that equation (5) is identical in form to equation (2), except that the view factor has been omitted, which is typical for surfaces with a completely unobstructed line-of-sight to its ambient surroundings. In embodiments in which this is not the case, the view factor can be added to equation (5), and values of the view factor can be determined as described hereinabove with respect to equation (2).

The heat transfer variables $Q_{TDC}$ and $Q_{TDR}$ are additive so that the total thermal energy, $TE_{TD}$, transferred from the thermal energy dissipating medium 20 to ambient is given by the sum of equations (4) and (5) to yield:

$$TE_{TD}=A_Sh(T_S-T_{AMB})+A_S\sigma\epsilon(T_S^4-T_{AMB}^4) \quad (6).$$

It should be noted that the thermal energy, $TE_{TD}$, transferred from the thermal energy dissipating medium 20 to ambient is directly proportional to both the total surface area, $A_S$, of the thermal energy dissipating medium 20 that is exposed to ambient and the surface emissivity, $\epsilon$, of the thermal energy dissipating medium 20. The total amount of heat that can be rejected by the thermal energy dissipating medium 20 to ambient can thus be increased by increasing the total surface area, $A_S$, of the thermal energy dissipating medium that is exposed to ambient. This may be done, for example, by increasing the lengths L1 and/or L2 of the thermal energy dissipating medium, such as by adding one or more extended and/or folded edges to either or both of L1 and L2, by adding one or more fin structures to L1 and/or L2, by drilling holes into the surface of the thermal energy dissipating medium 20, or the like. The total amount of heat that can be rejected by the thermal energy dissipating medium 20 to ambient can also be increased by increasing surface emissivity of the thermal energy dissipating medium 20, such as by coating one or more of the exposed surfaces of the thermal energy dissipating medium 20 with a known high surface emissivity coating.

Figure 15:
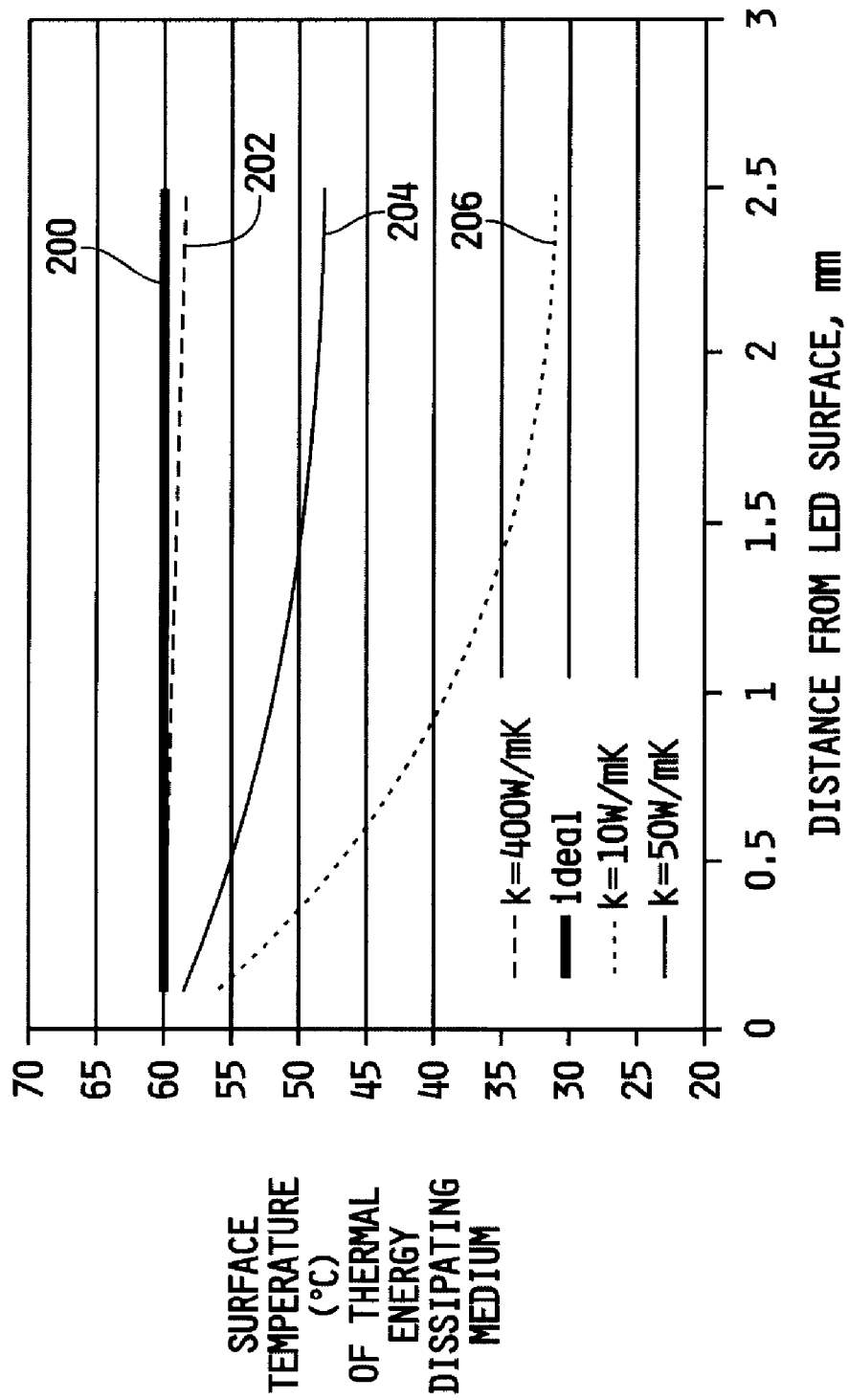
FIG. 15 is a plot of thermal energy dissipation medium surface temperature vs. distance from the surface of a light emitting diode circuit.

Equation (6) represents an approximation of the rejected heat, $TE_{TD}$, in which the surface temperature, $T_S$, of the thermal energy dissipating medium 20 is assumed to be constant across the surface area, $A_S$. While this is not strictly true and the surface temperature, $T_S$, actually varies across the surface of the thermal energy dissipating medium, it is an acceptable approximation as long as the thermal conductivity, k (W/mK) is sufficiently high. Referring to FIG. 15, for example, a plot is shown of surface temperature, $T_S$, of the thermal energy dissipating medium 20 as a function of the distance from the side surface of the heat source, i.e., the side of the semiconductor circuit 12, in an embodiment in which the heat source is a light emitting diode (LED) circuit, the thermal energy dissipating medium 20 is a sheet or strip having lengths L1 and L2 that are both greater than the width W (see, for example, any of FIGS.) and in which W=1 mm. The line 200 represents an ideal thermal energy dissipating medium 200, i.e., with infinite or near-infinite thermal conductivity, and in the ideal case the surface temperature, $T_S$, of the thermal energy dissipating medium 20 is constant across the surface area, $A_S$. It is this ideal case on which equation (6) is based. The line 202 represents a thermal energy dissipating medium 20 having a thermal conductivity k=400 W/mK, which is representative of copper (see Table I). The line 204 represents a thermal energy dissipating medium 20 having a thermal conductivity k=50 W/mK, and the line 206 represents a thermal energy dissipating medium having a thermal conductivity k=10 W/mK. It should be apparent from FIG. 15 that as the thermal conductivity, k, of the thermal energy dissipating medium 20 decreases, so too does the accuracy of equation (6). Thus, high conductivity values, such as in excess of 50 W/mK and certainly those in excess of 200 W/mK, not only enable good heat conduction by the thermal energy dissipating medium, but such high values also acceptably allow for a simplified form of equation (6) as set forth above. For conductivity values less than 50 W/mK, not only is heat conduction by the thermal energy dissipating medium generally unacceptably low, such low values further require a more complication form of equation (6) to account for surface temperature differences about and along the surface area, $A_S$, of the thermal energy dissipating medium 20.

Equations (3) and (6), while useful for describing the transfer of thermal energy from within and through the encapsulating material 17 toward the outer periphery of the encapsulating material 17 (equation (3)) and for describing the transfer of thermal energy from the thermal energy dissipating medium 20 to ambient (equation (6)), can also be used to determine one or more thermal energy design parameters required to meet one or more operating parameter goals. As one example, by setting equation (3) equal to equation (6) and entering into these equations values for the known variables (i.e., variables that can be calculated based on other operating conditions), an approximation of the total surface area, $A_S$, for a given thickness, W, of the thermal energy dissipating medium 20 required to maintain a target thermal energy dissipating medium surface temperature can be calculated. With the total surface area, $A_S$, thus known, the particular shape and thickness of the thermal energy dissipating medium 20 can be designed that is suitable for the particular application. In such calculations; the junction temperature, $T_J$, of the semiconductor device 12 may be derived using known relationships from the magnitude of the drive current used to drive the semiconductor device 12. If the ambient temperature or temperature range can be estimated or otherwise determined, the remaining variables are measurable quantities, leaving only $A_S$ and W to solve for. Manipulating either or both of equations (3) and (6) to determine other useful design parameters will occur to those skilled in the art, and the determination of any such other useful design parameters is contemplated by this disclosure.

Referring now to FIGS. 3 and 4, another illustrative embodiment of a thermal energy dissipating arrangement 10' is shown for a semiconductor circuit 12'. In this embodiment, the semiconductor 12' includes a P-type semiconductor region or layer 22, an N-type semiconductor region or layer 24 formed on top of the region or layer 22, and a number of P-type regions or layers 26 and 28 extending into the top surface of the N-type region or layer 24. The P-type regions 26, 28 and the N-type region 24 together form a conventional "lateral" PNP transistor. An emitter 26 of the transistor is electrically connectable to a voltage V1 produced by a driver circuit 18', a collector 28 of the transistor is electrically connectable to an electrical load and a base 24 of the transistor is electrically connectable to a voltage V2 produced by the driver circuit 18'. When V1 is sufficiently above V2, a current, I, flows laterally from the emitter 28 to the collector 28 in a conventional manner. Current flow, I, through the semiconductor circuit 12' and across the semiconductor junctions defined between the emitter 26 and collector 28 is generally normal to a plane defined by the semiconductor junction 15, and thermal energy directed outwardly from the semiconductor circuit 12' due to such current flow is oriented upwardly away from the top surface of the semiconductor circuit 12' and into the encapsulating material 17' as illustrated in FIG. 3. Accordingly, the thermally conductive medium 20' in this embodiment is positioned substantially opposite to the plane defined by the semiconductor junctions defined between the emitter 26 and the collector 28, i.e., above the top surface of the semiconductor circuit 12' and in physical, thermally conductive contact with the upper surface of the encapsulating material 17'. The thermally conductive medium 20' illustratively extends completely over the top surface of the semiconductor circuit 12' in physical, thermally conductive contact with the encapsulating material 17' substantially opposite to the plane defined by the semiconductor junctions defined between the emitter 26 and the collector 28, as shown most clearly in FIG. 4, although this disclosure contemplates that the thermally conductive medium 20' in some embodiments may extend over only part of the top surface of the semiconductor circuit 20'. It will be understood that with semiconductor circuits that include one or more semiconductor junctions across which current flows laterally and vertically, a suitable thermally conductive medium may extend at least partially about the periphery of the semiconductor circuit and at least partially over the semiconductor circuit.

Referring now to FIG. 5, a cross-sectional view is shown of one illustrative embodiment of a thermal energy dissipating arrangement for one example electrical component 100 including a semiconductor circuit 102. In the illustrated embodiment, the electrical component 100 is a light emitting diode (LED) device including a semiconductor LED circuit 102 having a bottom surface 101 mounted to and in electrical contact with a mounting surface in the form of the tope portion of one electrically conductive lead 104 extending from the electrical component 100. The opposite top surface 103 of the LED circuit 102 emits radiation in response to current flow through the LED circuit 102 in a conventional manner. The top surface 103 of the semiconductor LED circuit 102 is also electrically connected via a conventional bond wire 106 to another electrically conductive lead 108 extending from the electrical component 100. It will be understood that the semiconductor LED circuit 102 includes a semiconductor junction as illustrated in FIG. 1 that is parallel with the mounting surface of the electrically conductive lead 104, although this junction is not specifically illustrated in FIG. 5.

The semiconductor LED circuit 102, the bond wire 106 and portions of the electrically conductive leads 104 and 108, including the mounting surface of the electrically conductive lead 104, are encapsulated and surrounded in a conventional LED encapsulating or potting material 110. The encapsulating material 110 defines a top portion 105 generally opposite to the top surface 103 of the LED circuit 102, a bottom portion 107 opposite to the mounting surface of the electrically conductive lead, and at least one side portion 109 extending between the top and bottom portions 105 and 107 respectively. In the embodiment illustrated in FIG. 5, the encapsulating material 110 of the LED 100 has a generally circular cross-section between the top portion 105 and the bottom portion 107, and in this embodiment the encapsulating material has only a single, circular side 109. However, this disclosure contemplates other LED embodiments in which the encapsulating material 110 has more than one side, and it would be a mechanical step to adapt the thermal energy dissipation arrangement illustrated and described in this disclosure to any such other LED embodiments.

In the embodiment illustrated in FIG. 5, the thermally conductive medium 112 is provided in the form of a ring or band that is embedded in the encapsulating material 110. The ring or band 112 is illustratively spaced apart from the semiconductor LED circuit 102 and extends completely about the periphery of the semiconductor circuit 102. Alternatively, the ring or band 112 may extend less than completely around the semiconductor LED circuit 102. In any case, at least a portion of the band or ring 112 is positioned substantially opposite to the plane defined by at least one semiconductor junction of the semiconductor LED circuit 102, and is electrically isolated from the LED circuit 102.

Referring now to FIG. 6, a cross-sectional view of another illustrative embodiment of a thermal energy dissipating arrangement for another example electrical component 100' including the semiconductor circuit 102. In the illustrated embodiment, the electrical component 100' is a light emitting diode (LED) device as described with respect to FIG. 5, but without a thermally conductive band or ring embedded in the encapsulating or potting material 110. Rather, in the embodiment illustrated in FIG. 6, the thermally conductive medium 114 is provided in the form of a ring or band or plate that extends at least partially about, and in physical, thermally conductive contact with, an outer surface of the side 109 of the encapsulating material 110. The ring or band or plate 114 is illustratively spaced apart from the semiconductor LED circuit 102 and extends completely about the outer surface of the encapsulating or potting material 110. Alternatively, the ring or band 114 may extend less than completely around the outer surface of the encapsulating or potting material 110. In any case, at least a portion of the band or ring 114 is positioned substantially opposite to the plane defined by at least one semiconductor junction of the semiconductor LED circuit 102. The outer diameter of the ring or band or plate may be selected to achieve one or more thermal energy dissipating goals. Referring to FIG. 7, for example, an example electrical component 100'' is illustrated in which the thermally conductive medium 114' is provided in the form of a concentric plate 114' having an outer diameter that is sized to achieve one or more thermal energy dissipating goals, e.g., to effectively absorb thermal energy from the device 100″ and effectively reject thermal energy to the ambient surrounding the plate 114′. The concentric plate 114′ has an inner diameter 113 that is sized to fit tightly against the outer periphery of the encapsulating material 110 to thereby form physical, thermally conductive contact between the inner diameter of the concentric plate 114′ and the outer periphery of the encapsulating material 110 such that the concentric plate 114′ defines an annular ring. In one embodiment, the concentric plate 114′ may be provided in the form of a conventional washer formed from any one or more known materials that may include, but should not be limited to, one or more of the materials listed in Table I above. It will be understood that the concentric shape of the outer periphery of the plate (or washer) 114′ illustrated in FIG. 7 is provided only for illustrative purposes, and that the outer periphery of the plate (or washer) 114′ may alternatively be provided in any desired geometric shape.

Referring now to FIG. 8, a cross-sectional view of yet another illustrative embodiment of a thermal energy dissipating arrangement for another example electrical component 100′″ including the semiconductor circuit 102. In the illustrated embodiment, the electrical component 100″ is a light emitting diode (LED) device as described with respect to FIGS. 5 and 6, but without a thermally conductive band or ring or plate embedded in the encapsulating or potting material 110 or extending at least partially about an outer surface of the encapsulating or potting material 110. Rather, in the embodiment illustrated in FIG. 8, the thermally conductive medium 114 is provided in the form of thermally conductive particles 116 intermixed with at least a portion of the encapsulating or potting material 110′. In one embodiment, for example, the thermally conductive particles 116 are provided in the form of a thermally conductive powder. Alternatively or additionally the thermally conductive particles 116 may be provided in the form of loose, ground medium prepared by, for example, grinding and/or shaving a solid form of the thermally conductive medium. In any case, the thermally conductive particles 116 extend at least partially about the semiconductor LED circuit 102, and may further be intermixed with the entire encapsulating or potting material 110′ as illustrated in FIG. 8. In any case, at least a portion of the thermally conductive particles 116 is positioned substantially opposite to the plane defined by at least one semiconductor junction of the semiconductor LED circuit 102.

Referring now to FIG. 9, a front elevational view is shown of one illustrative embodiment of a thermal energy dissipating arrangement 120 for a plurality of electrical components 130 generally of the type illustrated in FIGS. 5-7. In the illustrated embodiment, the thermal energy dissipating arrangement 120 acts not only as a thermal energy dissipating medium as described hereinabove, but also acts as a component mounting arrangement for the plurality of electrical components 130. The plurality of electrical components 130 are generally of the type illustrated in FIGS. 5-7, but instead of the single thermally conductive ring or band or plate 114, an array 140 consisting of a plurality of interconnected rings or bands is provided. The array 140 defines a plurality of rings or bands 142$_1$, 142$_2$, 142$_3$, . . . each sized to receive therein a different one of the plurality of electrical components. Each of the plurality of rings or bands 142$_1$, 142$_2$, 142$_3$, . . . is interconnected to adjacent rings or bands by thermally conductive interconnecting members 144$_1$, 144$_2$, 144$_3$, 144$_4$, etc. Illustratively, the rings or bands 142$_1$, 142$_2$, 142$_3$, . . . are sized to receive and hold a different one of the electrical components 130 therein to provide not only a thermal energy dissipating mechanism for each of the plurality of electrical components 130, but also a mounting structure for the plurality of electrical components 130. Each of the plurality of rings or bands 142$_1$, 142$_2$, 142$_3$, . . . illustratively extend completely about outer surface of a corresponding one of the electrical components 130. Alternatively, one or more of the plurality of rings or bands 142$_1$, 142$_2$, 142$_3$, . . . may extend less than completely around corresponding ones of the plurality of electrical components 130. In any case, at least a portion of each of the plurality of bands or rings 142$_1$, 142$_2$, 142$_3$, . . . is positioned substantially opposite to the plane defined by at least one semiconductor junction of each corresponding semiconductor LED circuit 102.

Figure 10:
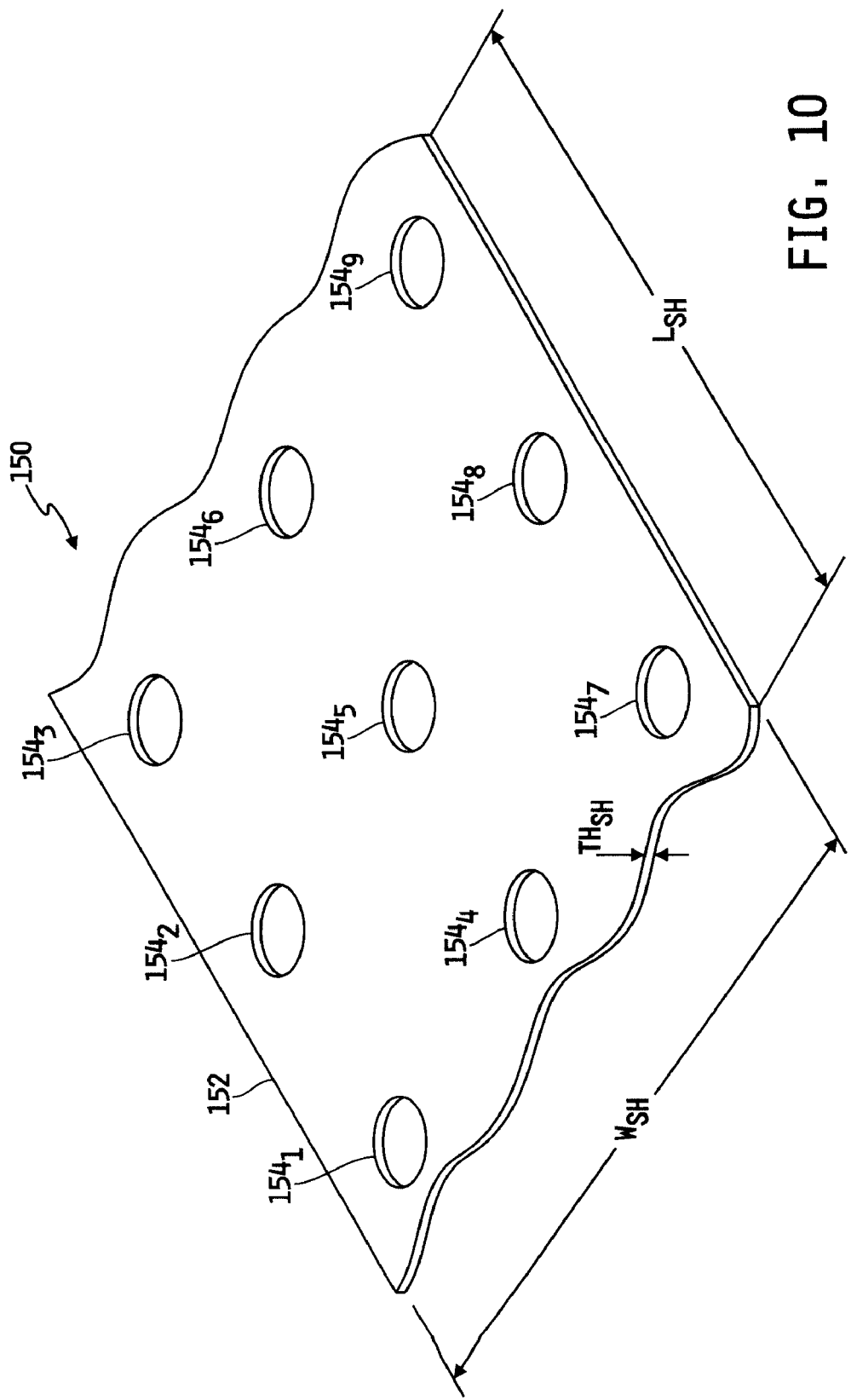
FIG. 10 is a perspective view of another illustrative embodiment of a thermal energy dissipating arrangement for a plurality of electrical components generally of the type illustrated in FIG. 5, which thermal energy dissipating arrangement also acts as a component mounting arrangement for the plurality of electrical components.
Figure 11:
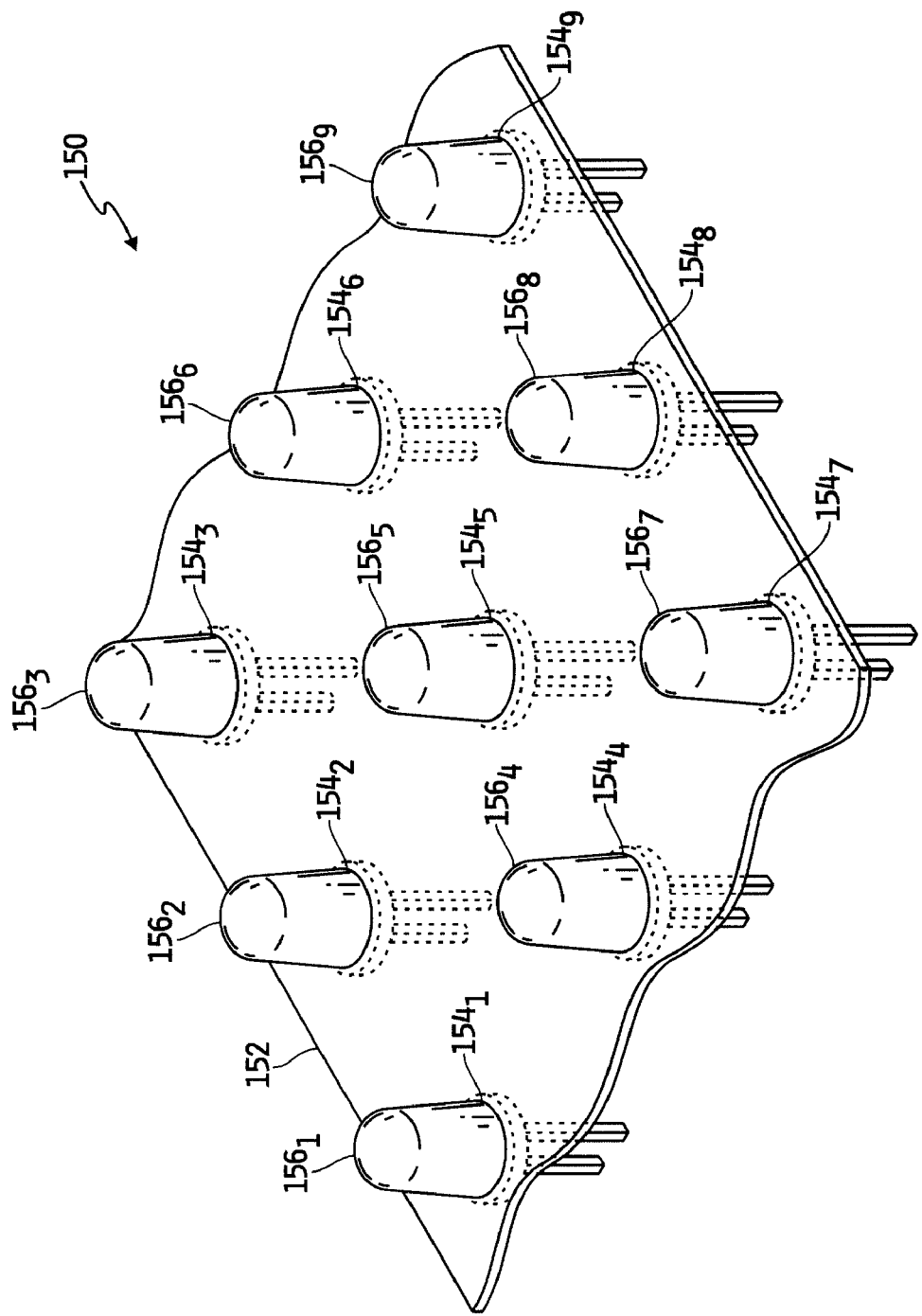
FIG. 11 is a perspective view of the thermal energy dissipating arrangement of FIG. 10 with a plurality of electrical components mounted thereto.

Referring now to FIGS. 10 and 11, a perspective view is shown of another illustrative embodiment of a thermal energy dissipating arrangement 150 for a plurality of the electrical components generally of the type illustrated in FIGS. 5-7 (e.g., light emitting diodes or LEDs), and that also acts as a component mounting arrangement for the plurality of electrical components, e.g., 156$_1$-156$_9$. In the illustrated embodiment, the thermal energy dissipating arrangement 150 acts not only as a thermal energy dissipating medium as described hereinabove, but also acts as a component mounting arrangement, i.e., an electrical component carrier, for the plurality of electrical components, e.g., 156$_1$-156$_9$. The plurality of electrical components 156$_1$-156$_9$ are generally of the type illustrated in FIGS. 5-7, but instead of the single thermally conductive ring or band 114 a thermally conductive sheet 152 consisting of a plurality of openings 154$_1$-154$_9$ is provided. The sheet 152 has a length, $L_{SH}$, (which is shown truncated in FIG. 10), a width, $W_{SH}$, and a thickness, $TH_{SH}$. Generally, the length, $L_{SH}$, and Width, $W_{SH}$, are both greater than the thickness, $TH_{SH}$, and, depending upon the number of electrical components mounted thereto, the length, $L_{SH}$, and Width, $W_{SH}$, may either or both be much greater than the thickness, $TH_{SH}$. Each of the plurality of openings 154$_1$-154$_9$ is illustratively sized to receive and securely hold therein a different one of the plurality of electrical components 156$_1$-156$_9$ to provide not only a thermal energy dissipating mechanism for each of the plurality of electrical components 156$_1$-156$_9$, but also a mounting and carrying structure for the plurality of electrical components 156$_1$-156$_9$, such that the sheet 152 acts as a combination thermal energy dissipation medium and electrical component carrier. At least a portion of each of the plurality of openings 154$_1$-154$_9$ is illustratively positioned substantially opposite to the plane defined by at least one semiconductor junction of each corresponding semiconductor LED circuit 102. The inner diameters of the openings 154$_1$-154$_9$ are sized to fit tightly against the outer peripheries, i.e., exterior surface, of the side(s) of the encapsulating material 110 of the various electrical components 156$_1$-156$_9$ to thereby form physical, thermally conductive contact between the walls defined by the inner diameters of the openings 154$_1$-154$_9$ and the outer peripheries, i.e., exterior surface, of the side(s) of the electrical components 156$_1$-156$_9$. The thermally conductive sheet 152 may be formed of any one, or combination, of thermally conductive materials of the type described hereinabove. It will be understood that while FIGS. 10 and 11 show a thermal energy dissipating arrangement 150 for receiving and holding 9 LEDs, this disclosure contemplates embodiments of the thermal energy dissipating arrangement 150 that is configured to receive and hold more or fewer LEDs or other semiconductor-based electrical components. In any case, as described hereinabove with respect to FIG. 1, one or more additional thermally conductive media may be interposed in the interface between any one or more of the openings 154$_1$-154$_9$ and the outer peripheries of the electrical components 156$_1$-156$_9$. Examples of such additional thermally conductive media include, but are not limited to, any one or combination of conventional thermally conductive greases and conventional thermally conductive bonding media such as conventional conductive adhesives, thermally conductive epoxies, or the like.

Figure 12:
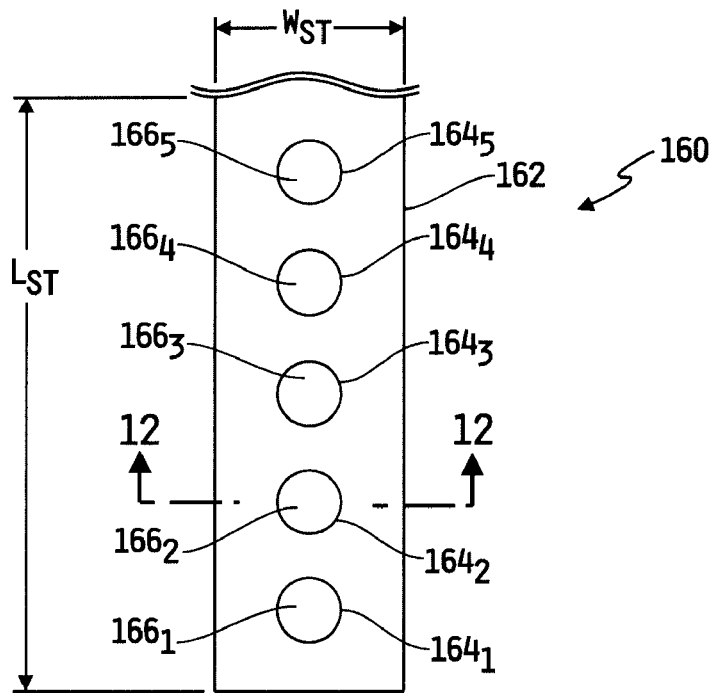
FIG. 12 is a top plan view of yet another illustrative embodiment of a thermal energy dissipating arrangement for a plurality of electrical components generally of the type illustrated in FIG. 5, which thermal energy dissipating arrangement also acts as a component mounting arrangement for the plurality of electrical components.

Referring now to FIG. 12, a top plan view is shown of yet another thermal energy dissipating arrangement 160 for a plurality of the electrical components generally of the type illustrated in FIGS. 5-7 (e.g., light emitting diodes or LEDs), and that also acts as a component mounting arrangement, i.e., an electrical component carrier, for a plurality of electrical components, e.g., $166_1$-$166_5$. The plurality of electrical components $166_1$-$166_5$ are generally of the type illustrated in FIGS. 5-7, but instead of the single thermally conductive ring or band 114 a thermally conductive strip 162 consisting of a plurality of openings $164_1$-$164_5$ is provided. The strip 162 has a length, $L_{ST}$, (which is shown truncated in FIG. 12), a width, $W_{ST}$, and a thickness, $TH_{ST}$. Generally, the length, $L_{ST}$, and Width, $W_{ST}$, are both greater than the thickness, $TH_{ST}$, and, depending upon the number of electrical components mounted thereto, the length, $L_{ST}$, and/or Width, $W_{ST}$, may either or both be much greater than the thickness, $TH_{ST}$. Each of the plurality of openings $164_1$-$164_5$ is illustratively sized to receive and securely hold therein a different one of the plurality of electrical components $166_1$-$166_5$ to provide not only a thermal energy dissipating mechanism for each of the plurality of electrical components $166_1$-$166_4$, but also a mounting and carrying structure for the plurality of electrical components $166_1$-$166_4$. At least a portion of each of the plurality of openings $164_1$-$164_5$ is positioned substantially opposite to the plane defined by at least one semiconductor junction of each corresponding semiconductor LED circuit 102. The inner diameters of the openings $164_1$-$164_5$ are sized to fit tightly against the outer peripheries, i.e., the exterior surface, of the side(s) of the encapsulating material 110 of the various electrical components $166_1$-$166_5$ to thereby form physical, thermally conductive contact between the inner diameters of the openings $164_1$-$164_5$ and the outer peripheries, i.e., the exterior surface, of the side(s) of the electrical components $166_1$-$166_5$. The thermally conductive strip 162 may be formed of any one, or combination, of thermally conductive materials of the type described hereinabove. It will be understood that while FIG. 12 shows a thermal energy dissipating arrangement 160 for receiving and holding 5 LEDs, this disclosure contemplates embodiments of the thermal energy dissipating arrangement 160 that is configured to receive and hold more or fewer LEDs or other semiconductor-based electrical components. In any case, as described hereinabove with respect to FIG. 1, one or more additional thermally conductive media may be interposed in the interface between any one or more of the openings $164_1$-$164_9$ and the outer peripheries of the electrical components $166_1$-$166_9$. Examples of such additional thermally conductive media include, but are not limited to, any one or combination of conventional thermally conductive greases and conventional thermally conductive bonding media such as conventional conductive adhesives, thermally conductive epoxies, or the like.

It will be appreciated that the thermal energy dissipating sheet 152 illustrated in FIGS. 10-11 generally differs from the thermal energy dissipating strip 162 only in the arrangement of electrical components, e.g., LEDs, mounted thereto. In particular, FIGS. 10-11 show a matrix of LEDs mounted to the thermal energy dissipating sheet 152, i.e., an m×n array of LEDs where m and n may be any positive integer greater than 1, whereas FIG. 12 shows a single row of LEDs mounted to the thermal energy dissipating strip 162, i.e., a 1×p array of LEDs where p may be any positive integer greater than 1. The thermal energy dissipating sheet 152 may otherwise be identical to the thermal energy dissipating strip 162, and as used hereinafter the term "thermal energy dissipating sheet" may be understood to generally identify a thermal energy dissipating sheet or strip, it being understood that a "strip" in this context is a subset of a "sheet." It will further be appreciated that any such single row or matrix of LEDs carried by such a thermal energy dissipating sheet or strip may be arranged linearly or non-linearly about the sheet or strip.

Figure 13A:
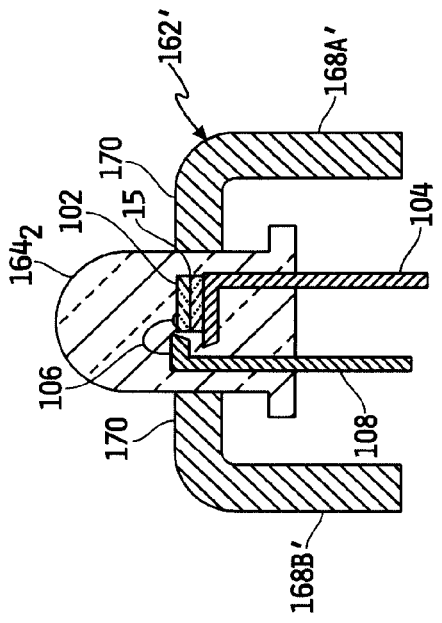
FIG. 13A is a cross-sectional view of the embodiment shown in FIG. 12.
Figure 13B:
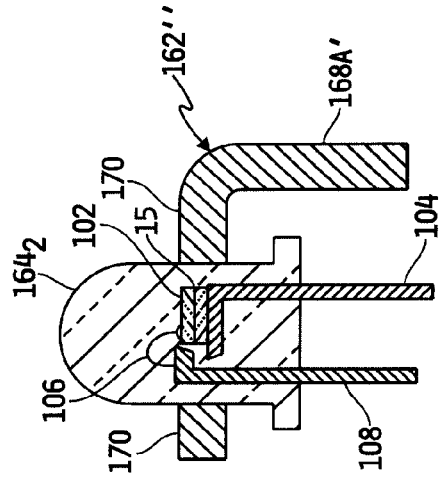
FIG. 13B is a cross-sectional view of the embodiment illustrated in FIG. 12 with a first modified geometry of the thermal energy dissipating arrangement.

Referring now to FIGS. 13A-13B, cross-sections of the thermal energy dissipating arrangement 160 are shown illustrating various different geometries of the thermal energy dissipating medium 162. In FIG. 13A, for example, the thermal energy dissipating structure 162 illustrated in FIG. 12 is shown in which the thermal energy dissipating structure 162 defines a single planar structure positioned relative to the LED $164_2$ to be substantially centrally aligned with the junction 15 of the semiconductor circuit 102. The planar "wings" 168A and 168B of the thermal energy dissipating structure 162 are illustratively equal in length, although in alternate embodiments the length of one wing 168A, 168B may be different from the length of the other wing 168B, 168A.

Referring to FIG. 13B, a modification 162' of the thermal energy dissipating structure 162 illustrated in FIG. 12 is shown in which the thermal energy dissipating structure 162' includes a planar region 170 positioned about the LED $164_2$ to be substantially centrally aligned with the junction 15 of the semiconductor circuit 102. A pair of "wings" 168A' and 168B' extend downwardly from, and at an angle relative to, the planar region 170 on opposite sides of the LED $164_2$. In the illustrated embodiment, the angle of each wing 168A' and 168B' relative to the planar region is approximately 90 degrees, although the angle of each wing 168A', 168B' relative to the planar section 170 may alternatively be different and/or one or both may be an angle other than 90 degrees. The total length of each wing 168A', 168B' of the thermal energy dissipating structure 162' is illustratively equal to the other, although in alternate embodiments the length of one wing 168A', 168B' may be different from the length of the other wing 168B', 168A'.

Figure 13C:
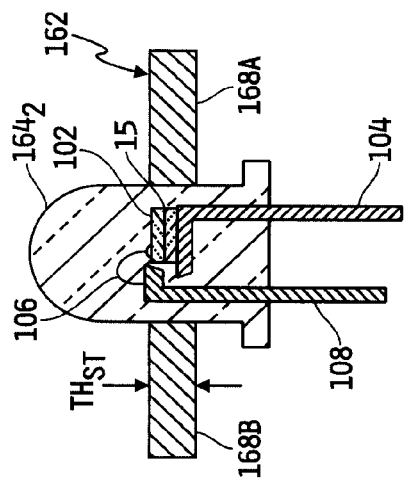
FIG. 13C is a cross-sectional view of the embodiment illustrated in FIG. 12 with a second modified geometry of the thermal energy dissipating arrangement.

Referring to FIG. 13C, another modification 162" of the thermal energy dissipating structure 162 illustrated in FIG. 12 is shown in which the thermal energy dissipating structure 162" includes a planar region 170 positioned about the LED $164_2$ to be substantially centrally aligned with the junction 15 of the semiconductor circuit 102. A single "wing" 168A' extend downwardly from, and at an angle relative to, the planar region 170 on one side of the LED $164_2$ only. In the illustrated embodiment, the angle of the wing 168A' relative to the planar region is approximately 90 degrees, although the angle of the wing 168A' relative to the planar region 170 may alternatively be different and/may be an angle other than 90 degrees.

Figure 13D:
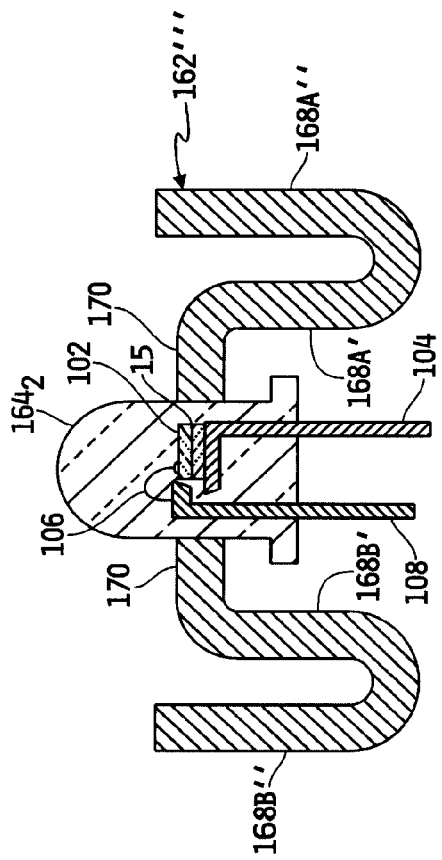
FIG. 13D is a cross-sectional view of the embodiment illustrated in FIG. 12 with a third modified geometry of the thermal energy dissipating arrangement.

Referring to FIG. 13D, yet another modification 162'" of the thermal energy dissipating structure 162 illustrated in FIG. 12 is shown in which the thermal energy dissipating structure 162'" includes a planar region 170 positioned about the LED $164_2$ to be substantially centrally aligned with the junction 15 of the semiconductor circuit 102. A pair of "wings" 168A' and 168B' extend downwardly from, and at an angle relative to, the planar region 170 on opposite sides of the LED $164_2$, and another pair of wings 168A" and 168B" extend upwardly from, and at angle relative to, the wings 168A' and 168B' respectively. In the illustrated embodiment, the angle of each wing 168A' and 168B' relative to the planar region is approximately 90 degrees, and the angle of each wing 168A", 168B" relative to the wing 168A' and 168B' respectively, is approximately 180 degrees, although the angle of each wing 168A', 168B' relative to the planar section 170 may alternatively be different and/or one or both may be an angle other than 90 degrees, and/or the angle of each wing 168A", 168B" relative to the wing 168A' and 168B' respectively may alternatively be different and/or one or both may be an angle other than 180 degrees. The total length of each wing 168A', 168B' of the thermal energy dissipating structure 162' is illustratively equal to the other, and the total length of each wing 168A", 168B" is illustratively equal to the other. In alternate embodiments, however, the length of the wing 168A' may be different from the length of the wing 168B', and/or the length of the wing 168A" may be different from the length of the wing 168B".

Those skilled in the art will appreciate that the thermal energy dissipation structure 162 may be modified to take other forms not specifically illustrated herein, for the purpose of providing a desired amount of surface area, $A_S$, of the thermal energy dissipating medium. It will be understood that any such other forms are contemplated by this disclosure.

Figure 14:
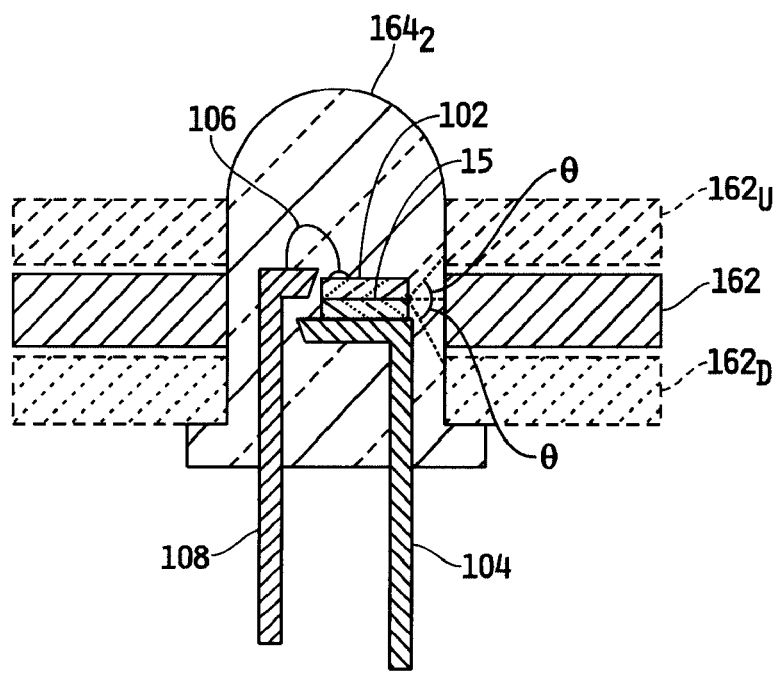
FIG. 14 is a cross-sectional view of the embodiment illustrated in FIGS. 12 and 13A illustrating the electrical component mounted to a number of juxtaposed thermal energy dissipating arrangements.

Referring now to FIG. 14, a cross-sectional view of the embodiment illustrated in FIGS. 12 and 13A is shown illustrating the LED 164$_2$ mounted to a number of juxtaposed thermal energy dissipating structures 162, 162U and 162D. The thermal energy dissipating structure 162 is illustratively as described with respect to FIGS. 12 and 13A, and is positioned relative to the LED 164$_2$ as also described with respect to FIG. 13A. This disclosure contemplates that any one or more of the electrical components illustrated and described herein may also be mounted to one or more additional thermal energy dissipating media. As illustrated in FIG. 14, for example, a lower thermal energy dissipation structure 162$_D$ (shown in phantom) may be mounted to the LED 164$_2$ beneath the thermal energy dissipating structure 162 to enhance rejection of thermal energy to ambient. Alternatively or additionally, an upper thermal energy dissipating structure 162$_U$ (shown in phantom) may be mounted to the LED 164$_2$ above the thermal energy dissipating structure 162 to alternatively or additionally enhance rejection of thermal energy to ambient. Alternatively still, the thermal energy dissipating structure 162 may be omitted, and the LED 164$_2$ may be mounted only to either or both of the thermal energy dissipation structures 162$_U$ and 162$_D$.

In embodiments in which the LED 164$_2$ is mounted to only one of the thermal energy dissipating structures 162$_U$ or 162$_D$, FIG. 14 further illustrates the effect described hereinabove with misalignment of the thermal energy dissipating structure relative to the semiconductor junction 15. For example, if the thermal energy dissipating structure 162$_U$ or 162$_D$ is positioned relative to the semiconductor junction 15 to define an angle, θ, between the plane defined by the semiconductor junction 15 and a center point of the width of the thermal energy dissipating structure 162$_U$ or 162$_D$, the transfer of thermal energy from the heat source to the thermal energy dissipation structure 162$_U$ or 162$_D$ will decrease by a factor of cos θ. However, because an upper portion of the electrically conductive lead 104 also forms a lead frame to which the semiconductor circuit is mounted, at least a portion of this lead frame will be part of the heat source. Thus, a low misalignment of the thermal energy dissipating structure, e.g., 162$_D$, should not decrease the transfer of thermal energy from the heat source as much as a high misalignment of the thermal energy dissipating structure, e.g., 162, because the lower thermal energy dissipating structure 162$_D$ is better aligned with the total heat source than is the upper thermal energy dissipating structure 162. In any case, it is desirable for the thermal energy dissipation structure to intersect the plane defined by the semiconductor junction 15 at an angle, θ, of less than or equal to a predefined angle. For example, it is desirable for the angle, θ, to be less than or equal to about 60 degrees, it is more desirable for the angle, θ, to be less than or equal to about 45 degrees, and it is even more desirable for the angle, θ, to be less than equal to about 15 degrees, and ideally it is desirable for the angle, θ, to be about zero degrees such that the plane defined by the semiconductor junction 15 substantially bisects the thermal energy dissipation structure.

It should be noted that the thermal energy dissipating media illustrated and described herein is in all instances separate from the lead frame or other mounting surface to which the semiconductor circuit is mounted and is electrically isolated from all voltage and/or current carrying conductive paths, i.e., it is not electrically connected in any way to the semiconductor circuit or any voltage/current carrying conductors. However, because the thermal energy dissipating media may illustratively be formed from one or more electrical conductive materials, this disclosure contemplates that in such cases the thermal energy dissipating media may, but need not, be electrically connected to the ground potential.

In various embodiments shown and described herein in which the semiconductor circuit includes an LED circuit encapsulated in transparent or otherwise light (radiation) transmissive encapsulating material, the thermal energy dissipating material is arranged to contact the sides of the exterior surface, e.g., about the outer periphery, of the encapsulating material as described hereinabove. Illustratively, the thermal energy dissipating material is positioned relative to the LED circuit such that the thermal energy dissipating material is directly opposite to, and generally aligned with, the plane defined by the junction of the LED circuit. Alternatively, as illustrated and described with respect to FIG. 14, the thermal energy dissipating material can be positioned such that it is offset, e.g., either higher or lower, by an angle θ relative to the plane defined by the junction of the LED circuit, although this may result in a reduction of thermal energy dissipation by a factor of cos θ. In other alternative embodiments, as also illustrated and described with respect to FIG. 14, the thermal energy dissipating medium may be provided in the form of multiple, e.g., stacked, sheets, strips, bands or rings. In any such embodiments that include single or multiple layers of the thermal energy dissipating medium, a single surface of each thermal energy dissipating medium having width W is in physical, thermally conductive contact with the sides of the encapsulating material, as the term "physical, thermally conductive" contact is defined herein. It is only this surface of width W that absorbs thermal energy from the LED device, and all other surfaces of each thermal energy dissipating medium serve to reject heat to the ambient environment surrounding the thermal energy dissipating medium as described herein. While one or more additional, conventional thermal energy dissipating structures may be may be used to contact the underside of the LED device, i.e., to contact the encapsulating material underneath the semiconductor circuit and lead frame combination, to thereby enhance the thermal energy management of the LED device, it will be understood that any such additional, conventional thermal energy dissipating structures are generally not necessary. Rather, the various thermal energy dissipating arrangements illustrated and described herein sufficiently dissipate, by themselves, thermal energy generated in LED devices as a result of current flow therethrough, and further allow the overall operating temperature of such LED devices to be controlled to acceptable temperature levels.

While the invention has been illustrated and described in detail in the foregoing drawings and description, the same is to be considered as illustrative and not restrictive in character, it being understood that only illustrative embodiments thereof have been shown and described and that all changes and modifications that come within the spirit of the invention are desired to be protected. For example, while some of the drawings illustrate the thermal energy dissipating arrangement implemented in or with one or more light emitting diodes (LEDs), it will be understood that the thermal energy dissipating concept described herein may be used with any semiconductor circuits, particularly those in which current flow under typical operating conditions would raise the temperature of the semiconductor circuit to undesirable levels in the absence of a thermal energy dissipating arrangement as described herein. Examples of such semiconductors include, but should not be limited to, power transistors, high current driver devices, amplifiers generally and audio amplifiers specifically, and the like.

What is claimed is:

1. Arrangement for dissipating thermal energy generated by a light emitting diode (LED), comprising:
    an LED including an LED circuit having a top surface from which radiation is emitted in response to current flow through the LED circuit and an opposite bottom surface mounted to a mounting surface, encapsulating material surrounding the LED circuit, the encapsulating material defining a top portion opposite the top surface of the LED circuit, a bottom portion opposite the bottom surface of the LED circuit and at least one side portion extending between the bottom portion and the top portion, a first electrical lead extending into the encapsulating material and electrically connected to the bottom surface of the LED circuit, and a second electrical lead extending into the encapsulating material and electrically connected to the top surface of the LED, and
    a thermal energy dissipating medium defining an opening therethrough sized to receive therein the LED such that the thermal energy dissipating medium defining the opening is in physical, thermally conductive contact with an exterior surface of the at least one side portion of the encapsulating material of the LED,
    wherein the thermal energy dissipating medium is not electrically connected to any of the LED circuit, the mounting surface, the first electrical lead and the second electrical lead,
    and wherein the thermal energy dissipating medium is formed of a material having a thermal conductivity of greater than or equal to 50 W/mK.

2. The arrangement of claim 1 wherein the thermal energy dissipating medium has a thickness through which the opening is formed.

3. The arrangement of claim 1 wherein the thickness is substantially uniform between the opening and an outer periphery of the thermal energy dissipating medium.

4. The arrangement of claim 1 wherein the thermal energy dissipating medium comprises copper (Cu).

5. The arrangement of claim 1 wherein the thermal energy dissipating medium comprises aluminum (Al).

6. The arrangement of claim 1 wherein the thermal energy dissipating medium comprises one or more of copper (Cu), Aluminum (Al), Gold (Au), Silver (Au), Magnesium (Mg), Tin (Sn), Zinc (Zn), Tungsten (W) and Beryllium (Be).

7. The arrangement of claim 1 wherein the thermal energy dissipating medium is formed of a material having a thermal conductivity of at least 200 W/mK.

8. The arrangement of claim 1 wherein the thermal energy dissipating medium is one of rigid, flexible and semi-flexible.

9. The arrangement of claim 1 wherein the thermal energy dissipating medium is separate from, and is not connected to, the mounting surface.

10. The thermal energy dissipating arrangement of claim 1 wherein the mounting surface forms part of the second electrical terminal.

11. The arrangement of claim 1 further comprising a high surface emissivity coating applied to one or more surface of the thermal energy dissipating medium.

12. The arrangement of claim 1 wherein an interface is defined between the opening defined through thermal energy dissipating medium and the at least one side of the encapsulating material of the LED,
    and further comprising a thermally conductive medium interposed in the interface, the thermally conductive medium facilitating transfer of the thermal energy from the LED to the thermal energy dissipating medium.

13. The arrangement of claim 12 wherein the thermally conductive medium comprises at least one of a thermally conductive grease and a thermally conductive bonding medium.

14. The arrangement of claim 1 wherein the LED circuit defines a semiconductor junction between the top and bottom surfaces thereof across which the current flows through the LED circuit, the semiconductor junction defining a plane that is substantially parallel with the top and bottom surfaces of the LED circuit.

15. The arrangement of claim 14 wherein the thermal energy dissipating medium about the opening is substantially aligned with the plane defined by the semiconductor junction of the LED circuit.

16. The arrangement of claim 14 wherein the thermal energy dissipation medium about the opening intersects an angle of less than or equal to a predefined angle relative to the plane defined by the semiconductor junction of the LED circuit.

17. The arrangement of claim 16 wherein the predefined angle is about 60 degrees.

18. The arrangement of claim 16 wherein the predefined angle is about 45 degrees.

19. The arrangement of claim 16 wherein the predefined angle is about 15 degrees.

20. The arrangement of claim 16 wherein the predefined angle is about zero degrees such that the plane defined by the semiconductor junction of the LED circuit substantially bisects the thermal energy dissipating medium about the opening.

* * * * *